(12) United States Patent
Wada et al.

(10) Patent No.: US 8,803,252 B2
(45) Date of Patent: Aug. 12, 2014

(54) SILICON CARBIDE SEMICONDUCTOR DEVICE

(71) Applicant: Sumitomo Electric Industries, Ltd., Osaka (JP)

(72) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/921,674

(22) Filed: Jun. 19, 2013

(65) Prior Publication Data

US 2014/0027784 A1 Jan. 30, 2014

Related U.S. Application Data

(60) Provisional application No. 61/675,645, filed on Jul. 25, 2012.

(30) Foreign Application Priority Data

Jul. 25, 2012 (JP) .................................. 2012-164274
Jan. 10, 2013 (JP) .................................. 2013-002655

(51) Int. Cl.
*H01L 29/66* (2006.01)

(52) U.S. Cl.
USPC ............. 257/409; 257/77; 257/328; 257/329; 257/339; 257/490; 257/495; 257/E29.104; 257/E29.257; 438/138; 438/931

(58) Field of Classification Search
CPC ............ H01L 29/0607; H01L 29/0615; H01L 29/0619; H01L 29/0626; H01L 29/063
USPC ........... 257/77, 328, 329, 339, 409, 490, 495, 257/E29.104, E29.257; 438/138, 931
See application file for complete search history.

(56) References Cited

U.S. PATENT DOCUMENTS 6,037,632 A   3/2000  Omura et al.
2009/0114969 A1  5/2009  Suzuki et al.

FOREIGN PATENT DOCUMENTS

| JP | 09-191109 A | 7/1997 |
| JP | 2008-270681 A | 11/2008 |
| JP | 2009-117593 A | 5/2009 |
| JP | 2010-232503 A | 10/2010 |
| WO | WO-97/47045 A1 | 12/1997 |

OTHER PUBLICATIONS

International Search Report and Written Opinion in PCT International Application No. PCT/JP2013/066078, dated Sep. 17, 2013.

*Primary Examiner* — Kenneth Parker
*Assistant Examiner* — John Lin
(74) *Attorney, Agent, or Firm* — Venable LLP; Michael A. Sartori

(57) ABSTRACT

A drift layer forms a first main surface of a silicon carbide layer and has a first conductivity type. A source region is provided to be spaced apart from the drift layer by a body region, forms a second main surface, and has the first conductivity type. A relaxing region is provided within the drift layer and has a distance $L_d$ from the first main surface. The relaxing region has a second conductivity type and has an impurity dose amount $D_{rx}$. The drift layer has an impurity concentration $N_d$ between the first main surface and the relaxing region. Relation of $D_{rx} > L_d \cdot N_d$ is satisfied. Thus, a silicon carbide semiconductor device having a high breakdown voltage is provided.

9 Claims, 28 Drawing Sheets

SILICON CARBIDE SEMICONDUCTOR DEVICE

BACKGROUND OF THE INVENTION

1. Field of the Invention

This invention relates to a silicon carbide semiconductor device and particularly to a silicon carbide semiconductor device having a gate insulating film and a method for manufacturing the same.

2. Description of the Background Art

In an Si (silicon) MOSFET (Metal Oxide Semiconductor Field Effect Transistor) representing a widely used power semiconductor device, a main factor determining a breakdown voltage is an upper limit of electric field intensity which a drift layer forming a breakdown voltage holding region can withstand. A drift layer made of Si may break down at a portion where electric field not lower than approximately 0.3 MV/cm is applied. Therefore, it is necessary to suppress electric field intensity to be less than a prescribed value in the entire drift layer of a MOSFET. The simplest method is to lower an impurity concentration in a drift layer. This method, however, is disadvantageous in high ON resistance of a MOSFET. Namely, there is trade-off relation between ON resistance and a breakdown voltage.

Japanese Patent Laying-Open No. 9-191109 describes trade-off relation between ON resistance and a breakdown voltage in connection with a typical Si MOSFET, taking into consideration a theoretical limit obtained from a physical property value of Si. Then, in order to overcome this trade-off, it has disclosed addition of a lower p-type embedded layer and an upper p-type embedded layer in an n base layer on an n-type substrate on a drain electrode. The lower p-type embedded layer and the upper embedded layer divide the n base layer into a lower portion, a middle portion, and an upper portion equal to one another in thickness. According to this document, an equally divided voltage is applied to the three portions and maximum electric field of each portion is kept at limit electric field intensity or lower.

As a method for greatly improving the trade-off described above, use of SiC (silicon carbide) instead of Si has actively been discussed in recent years. Unlike Si, SiC is a material which can sufficiently withstand even electric field intensity not lower than 0.4 MV/cm.

In a case where such high electric field may be applied, breakdown due to electric field concentration at a specific position in a MOSFET structure gives rise to a problem. For example, in a case of a trench-structure MOSFET, a breakdown phenomenon of a gate insulating film due to electric field concentration in the gate insulating film at a bottom portion, in particular a corner portion, of a trench is a main factor determining a breakdown voltage. Thus, a factor determining a breakdown voltage is different between an Si semiconductor device and an SiC semiconductor device. Therefore, if the technique in the document above which is considered to be premised on use of Si is simply applied for improvement of a breakdown voltage of an SiC semiconductor device, improvement in breakdown voltage by making full use of advantages in terms of physical properties of SiC cannot be achieved.

SUMMARY OF THE INVENTION

The present invention was made to solve the problems as described above, and an object of this invention is to provide a silicon carbide semiconductor device having a high breakdown voltage.

A silicon carbide semiconductor device according to the present invention has a silicon carbide layer, a gate insulating film, a gate electrode, and first and second electrodes. The silicon carbide layer has a first main surface and a second main surface opposite to the first main surface. The silicon carbide layer has a drift layer, a body region, and a source region. The drift layer forms the first main surface and has a first conductivity type. The body region is provided on the drift layer and has a second conductivity type different from the first conductivity type. The source region is provided on the body region to be spaced apart from the drift layer by the body region, forms the second main surface, and has the first conductivity type. The silicon carbide layer includes a relaxing region provided within the drift layer and having the second conductivity type. The relaxing region has an impurity dose amount $D_{rx}$ and has a distance $L_d$ from the first main surface. The drift layer has an impurity concentration $N_d$ between the first main surface and the relaxing region. Relation of $D_{rx} > L_d \cdot N_d$ is satisfied. The gate insulating film is provided on the body region so as to connect the source region and the drift layer to each other. The gate electrode is provided on the gate insulating film. The first electrode is opposed to the first main surface. The second electrode is opposed to the second main surface.

According to the silicon carbide semiconductor device above, the impurity dose amount in the relaxing region is increased to satisfy relation of $D_{rx} > L_d \cdot N_d$. Thus, when a voltage across the first and second electrodes becomes higher as the silicon carbide semiconductor device is set to an OFF state, the relaxing region is prevented from being completely depleted before a depletion layer sufficiently extends from the relaxing region to the first main surface of the silicon carbide layer. Thus, the depletion layer having a sufficient length can be formed between the relaxing region and the first main surface. Therefore, a ratio of a voltage across the first and second electrodes borne by a portion between the relaxing region and the first main surface is increased. In other words, a voltage borne by a portion shallower than the relaxing region is mitigated. Thus, electric field intensity in a portion shallower than the relaxing region can be lessened. In other words, electric field intensity in a portion where breakdown is likely due to electric field concentration can be lessened. Thus, a higher voltage can be applied across the first and second electrodes without causing breakdown. Namely, a breakdown voltage of the silicon carbide semiconductor device is raised.

Preferably, relation of $L_d \geq 5$ μm is satisfied. Thus, a depletion layer having a length of 5 μm at the maximum can be formed between the relaxing region and the first main surface. In other words, a depletion layer having a sufficient length can more reliably be formed between the relaxing region and the first main surface. Therefore, a breakdown voltage of the silicon carbide semiconductor device can further be raised.

Preferably, relation of $D_{rx} \geq 1 \times 10^{13}$ cm$^{-2}$ is satisfied. Thus, when a voltage across the first and second electrodes is raised as the silicon carbide semiconductor device is set to the OFF state, the relaxing region is prevented from being completely depleted before a depletion layer sufficiently extends from the relaxing region to the first main surface of the silicon carbide layer. Therefore, a breakdown voltage of the silicon carbide semiconductor device can further be raised.

Preferably, a breakdown voltage across the first and second electrodes is equal to or higher than 600 V. In a semiconductor device having a breakdown voltage not lower than 600 V, it is a more important issue to ensure a breakdown voltage. The silicon carbide semiconductor device having the features above can solve this issue.

Preferably, the silicon carbide semiconductor device has a single crystal substrate. The single crystal substrate is provided between the first main surface of the silicon carbide layer and the first electrode, is in contact with each of the first main surface of the silicon carbide layer and the first electrode, is composed of silicon carbide, has the first conductivity type, and has an impurity concentration higher than impurity concentration $N_d$. Thus, the drift layer and the first electrode are connected to each other with a single crystal substrate having an impurity concentration higher than impurity concentration $N_d$ being interposed. Therefore, contact resistance of the first electrode can be lower. Therefore, electrical resistance of the drift layer can accordingly be higher.

The second main surface of the silicon carbide layer may be provided with a trench. The trench has a sidewall surface passing through the source region and the body region to reach the drift layer and a bottom surface located on the drift layer. The gate insulating film covers each of the sidewall surface and the bottom surface of the trench. The relaxing region is provided at a position deeper than the bottom surface of the trench. In such a trench-structure silicon carbide semiconductor device, in ensuring a breakdown voltage, electric field applied to the gate insulating film should be suppressed. The silicon carbide semiconductor device having the features above can realize such suppression.

Preferably, a distance $L_{tr}$ between the relaxing region and the bottom surface of the trench is not greater than 4 µm. Thus, electric field concentration at the gate insulating film on the bottom surface of the trench can more effectively be suppressed. Therefore, a breakdown voltage of the silicon carbide semiconductor device can further be raised.

The second main surface of the silicon carbide layer may include a flat surface having the source region, the body region, and the drift layer. The gate insulating film may be provided on the flat surface. In such a planar-structure silicon carbide semiconductor device, in ensuring a breakdown voltage, electric field applied to an interface between the drift layer and the body region should be suppressed. The silicon carbide semiconductor device having the features above can realize such suppression.

Preferably, the body region is a well region having a side surface and a bottom surface as well as a corner portion between the side surface and the bottom surface. A distance $L_{pn}$ between the relaxing region and the corner portion of the well region is not greater than 4 µm. Thus, electric field concentration at the corner portion of the well region where breakdown is particularly likely can be suppressed. Therefore, a breakdown voltage of the silicon carbide semiconductor device can further be raised.

As described above, according to the present invention, a breakdown voltage can be raised.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
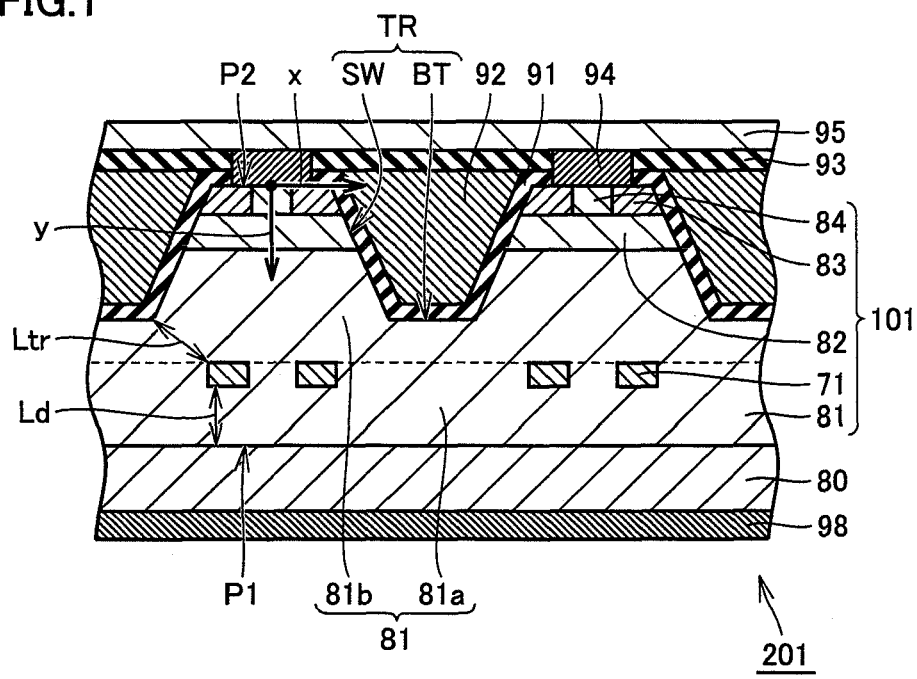
FIG. 1 is a partial cross-sectional view schematically showing a construction of a silicon carbide semiconductor device in a first embodiment of the present invention.

An embodiment of the present invention will be described hereinafter with reference to the drawings. It is noted that, in the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is normally expressed by a number with a bar "-" thereabove, however, a negative sign herein precedes a number.

First Embodiment

Figure 2:
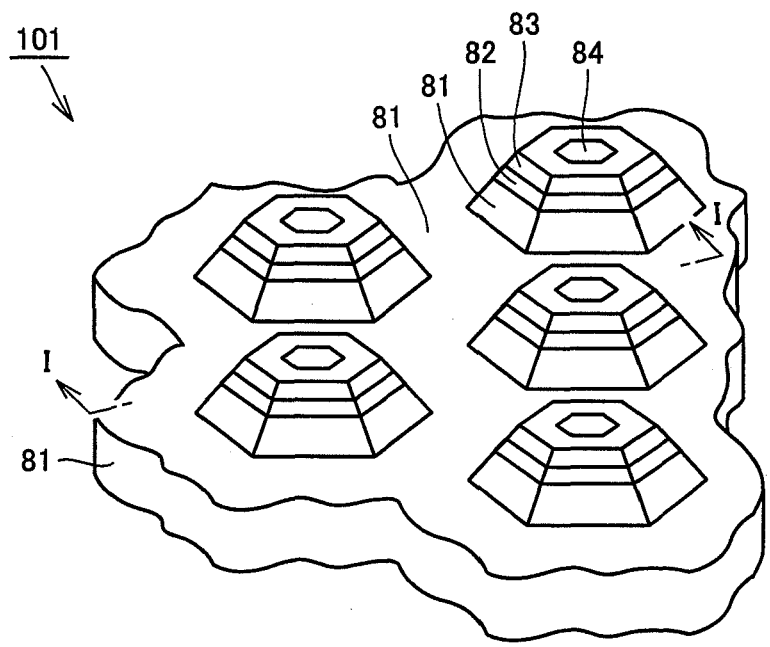
FIG. 2 is a partial perspective view schematically showing a shape of a silicon carbide layer in the silicon carbide semiconductor device in FIG. 1.
Figure 3:
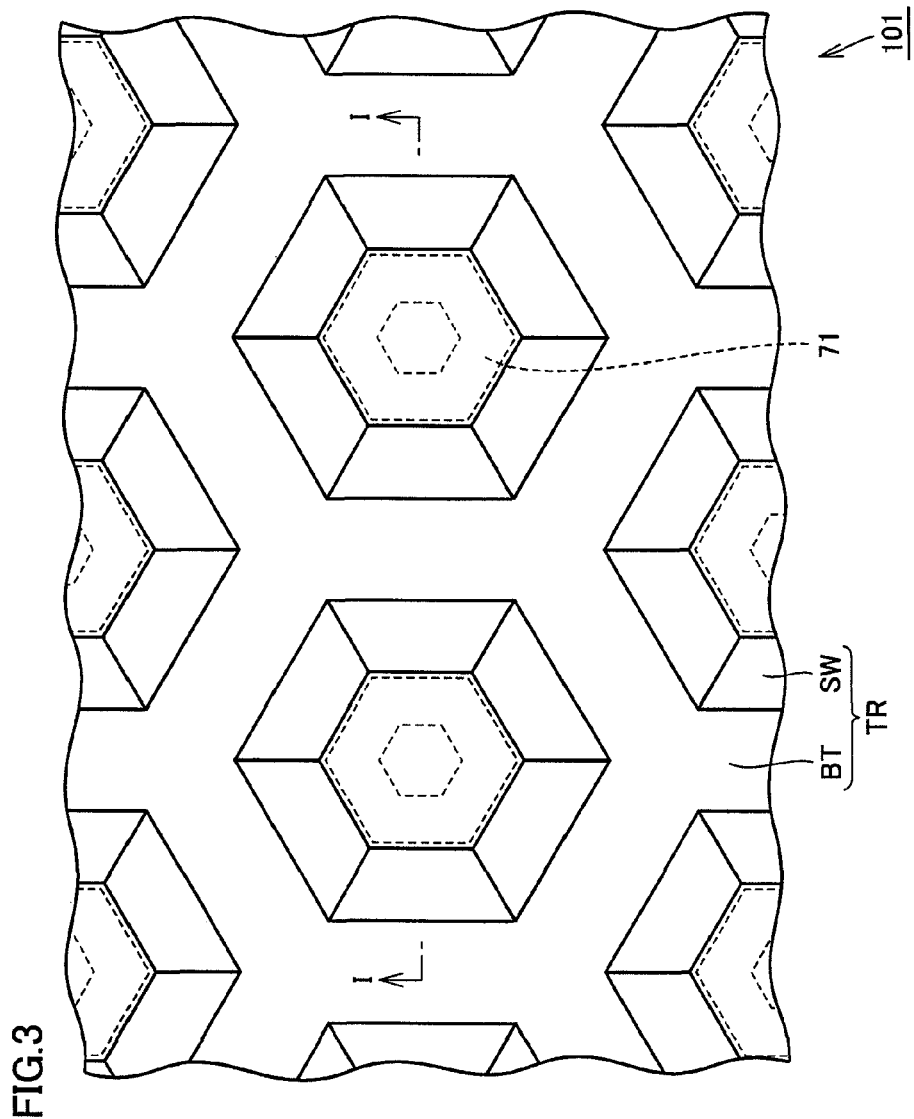
FIG. 3 is a partial top view schematically showing a shape of the silicon carbide layer in the silicon carbide semiconductor device in FIG. 1.

As shown in FIGS. 1 to 3, a MOSFET 201 (a silicon carbide semiconductor device) in the present embodiment has a single crystal substrate 80, an epitaxial layer 101 (a silicon carbide layer), a gate oxide film 91 (a gate insulating film), a gate electrode 92, an interlayer insulating film 93, a source electrode 94 (a second electrode), a source interconnection layer 95, and a drain electrode 98 (a first electrode). MOSFET 201 preferably has a breakdown voltage not lower than 600 V across drain electrode 98 and source electrode 94. In other words, MOSFET 201 is preferably a power semiconductor device having a high breakdown voltage.

Epitaxial layer 101 is a silicon carbide layer epitaxially grown on single crystal substrate 80. Epitaxial layer 101 has hexagonal crystal structure having a poly type of 4H. Epitaxial layer 101 has a lower surface P1 (a first main surface) facing single crystal substrate 80 and an upper surface P2 (a second main surface) opposite to lower surface P1. Epitaxial layer 101 has an n drift layer 81 (a drift layer), a p body layer 82 (a body region), an n region 83 (a source region), a p contact region 84, and a relaxing region 71.

N drift layer 81 has an n-type (a first conductivity type). N drift layer 81 has a lower drift layer 81a and an upper drift layer 81b. Lower drift layer 81a forms lower surface P1 of epitaxial layer 101. Relaxing region 71 is partially provided in a surface of lower drift layer 81a, opposite to lower surface P1. Upper drift layer 81b is provided on the surface of lower drift layer 81a opposite to lower surface P1. Thus, upper drift layer 81b covers relaxing region 71. An impurity concentration in n drift layer 81 is preferably lower than an impurity concentration in single crystal substrate 80. A donor concentration in n drift layer 81 is preferably not lower than $1 \times 10^{15}$ cm$^{-3}$ and not higher than $5 \times 10^{16}$ cm$^{-3}$ and it is set, for example, to $8 \times 10^{15}$ cm$^{-3}$. Preferably, an impurity concentration in lower drift layer 81a is equal to or lower than an impurity concentration in upper drift layer 81b and more preferably lower than the impurity concentration in upper drift layer 81b.

P body layer 82 has a p-type (a second conductivity type). P body layer 82 is provided on upper drift layer 81b. An impurity concentration in p body layer 82 is preferably not lower than $1 \times 10^{17}$ cm$^{-3}$ and not higher than $5 \times 10^{18}$ cm$^{-3}$ and it is set, for example, to $1 \times 10^{18}$ cm$^{-3}$.

N region 83 has the n-type. N region 83 is provided on p body layer 82 to be spaced apart from n drift layer 81 by p body layer 82. N region 83 forms upper surface P2 of epitaxial layer 101, together with p contact region 84. P contact region 84 has the p-type. P contact region 84 is connected to p body layer 82.

A trench TR is provided in upper surface P2 of epitaxial layer 101. Trench TR has a sidewall surface SW and a bottom surface BT. Sidewall surface SW passes through n region 83 and p body layer 82 to reach upper drift layer 81b. Sidewall surface SW includes a channel surface of MOSFET 201 on p body layer 82.

Sidewall surface SW is inclined with respect to upper surface P2 of epitaxial layer 101, so that trench TR expands in an inversely tapered shape toward an opening. A plane orientation of sidewall surface SW is inclined preferably by not smaller than 50° and not greater than 65° with respect to a {000-1} plane and more preferably inclined by not smaller than 50° and not greater than 65° with respect to a (000-1) plane. Preferably, sidewall surface SW has a prescribed crystal plane (also referred to as a special surface) in particular in a portion on p body layer 82. Details of the special surface will be described later.

Bottom surface BT is located on upper drift layer 81b. In the present embodiment, bottom surface BT has a flat shape substantially in parallel to upper surface P2. A portion where bottom surface BT and sidewall surface SW are connected to each other forms a corner portion of trench TR. In the present embodiment, trench TR extends to form a mesh having a honeycomb structure in a plan view (FIG. 3). Thus, epitaxial layer 101 has upper surface P2 surrounded by trenches TR and having a hexagonal shape.

Relaxing region 71 has the p-type. Relaxing region 71 is provided within n drift layer 81. Relaxing region 71 is spaced apart from p body layer 82 by upper drift layer 81b. In addition, relaxing region 71 is distant from each of sidewall surface SW and bottom surface BT of trench TR.

Relaxing region 71 has an impurity dose amount $D_{rx}$. Here, an impurity dose amount in connection with an already-formed relaxing region means an impurity concentration per unit area of relaxing region 71. Preferably, relation of $D_{rx} \geq 1 \times 10^{13}$ cm$^{-2}$ is satisfied. Relaxing region 71 has a distance $L_d$ from lower surface P1. Preferably, relation of $L_d \geq 5$ μm is satisfied. N drift layer 81 has an impurity concentration $N_d$ between lower surface P1 and relaxing region 71. In other words, lower drift layer 81a has impurity concentration $N_d$. Relation of $D_{rx} > L_d \cdot N_d$ is satisfied.

Preferably, relaxing region 71 is distant from p body layer 82 by not smaller than 1 μm and not greater than 5 μm. A value obtained by integrating impurity concentrations per unit volume of relaxing region 71 in a direction of thickness (a vertical direction in FIG. 1) corresponds to a dose amount in ion implantation for forming relaxing region 71. This dose amount is preferably not less than $1 \times 10^{12}$ cm$^{-2}$ and not more than $1 \times 10^{15}$ cm$^{-2}$ and it is set, for example, to $1 \times 10^{13}$ cm$^{-2}$. An impurity in relaxing region 71 is represented, for example, by aluminum. Relaxing region 71 is provided at least partially at a position deeper than a position of bottom surface BT of trench TR. Preferably, relaxing region 71 is provided only at a position deeper than a position of bottom surface BT of trench TR as shown in FIG. 1.

Relaxing region 71 is provided at a position deeper than bottom surface BT of trench TR. Relaxing region 71 is arranged at least partially outside bottom surface BT of trench TR in a plan view. A distance $L_{tr}$ between relaxing region 71 and trench TR is preferably not greater than 4 μm. Specifically, trench TR has a corner portion formed by sidewall surface SW and bottom surface BT and distance $L_{tr}$ between this corner portion and relaxing region 71 is preferably not greater than 4 μm. Preferably, relaxing region 71 is arranged only outside bottom surface BT of trench TR in a plan view as shown in FIG. 3. Preferably, in the plan view (FIG. 3), a distance between relaxing region 71 and bottom surface BT of trench TR is not smaller than 0.5 μm and not greater than 5 μm. In the present embodiment, relaxing region 71 has an opening in a plan view. Specifically, relaxing region 71 has an outer periphery and an opening substantially similar to upper surface P2 having a hexagonal shape.

Gate oxide film 91 covers each of sidewall surface SW and bottom surface BT of trench TR. Thus, gate oxide film 91 is provided on p body layer 82 so as to connect n region 83 and upper drift layer 81b to each other. Gate electrode 92 is provided on gate oxide film 91.

Single crystal substrate 80 is composed of silicon carbide and has the n-type. Epitaxial layer 101 is provided on single crystal substrate 80. Single crystal substrate 80 is provided between lower surface P1 of epitaxial layer 101 and drain electrode 98 and comes in contact with each of lower surface P1 of epitaxial layer 101 and drain electrode 98. Single crystal substrate 80 has an impurity concentration higher than impurity concentration $N_d$ in lower drift layer 81a. Preferably, an impurity concentration in single crystal substrate 80 is at least 50 times as high as impurity concentration $N_d$, and in this case, single crystal substrate 80 does not substantially have a breakdown voltage holding function.

Source electrode 94 is in contact with each of n region 83 and p contact region 84. Source interconnection layer 95 is in contact with source electrode 94. Source interconnection layer 95 is, for example, an aluminum layer. Interlayer insulating film 93 isolates gate electrode 92 and source interconnection layer 95 from each other.

Then, intensity of electric field in a direction of thickness (the vertical direction in FIG. 1) applied to gate oxide film 91 at a position lying between n drift layer 81 and the corner portion of trench TR while MOSFET 201 is in the OFF state (hereinafter referred to as corner portion electric field intensity) was simulated. Consequently, corner portion electric field intensity of MOSFET 201 having relaxing region 71 was 4.4 MV/cm. In contrast, in a comparative example not having a relaxing region, corner portion electric field intensity was 7.8 MV/cm. Namely, owing to relaxing region 71, corner portion electric field intensity decreased from 7.8 MV/cm to 4.4 MV/cm.

It is noted that, in this simulation, an impurity concentration in n drift layer 81 was set to $8 \times 10^{15}$ cm$^{-3}$, a voltage of drain electrode 98 with reference to source interconnection layer 95 was set to 600 V, a depth of trench TR was set to 1.65 μm, a position of relaxing region 71 was set to 3-μm depth from upper surface P2, aluminum was adopted as an impurity in relaxing region 71, a width of relaxing region 71 (a dimension in a lateral direction in FIG. 1) was set to 2 μm, acceleration energy during formation of relaxing region 71 was set to 100 keV, and a dose amount during formation of relaxing region 71 was set to $1 \times 10^{13}$ cm$^{-2}$.

A method of manufacturing MOSFET 201 (FIG. 2) will now be described below.

Figure 4:
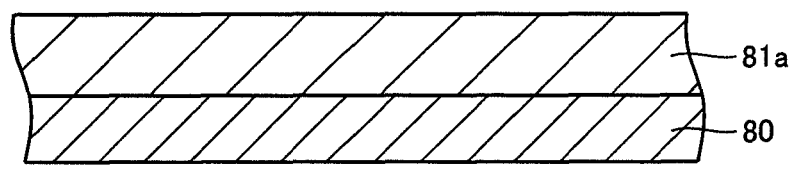
FIG. 4 is a partial cross-sectional view schematically showing a first step in a method for manufacturing the silicon carbide semiconductor device in FIG. 1.

As shown in FIG. 4, lower drift layer 81a forming a part of n drift layer 81 (FIG. 1) is formed on single crystal substrate 80. Specifically, lower drift layer 81a is formed through epitaxial growth on single crystal substrate 80. This epitaxial growth can be achieved with CVD (Chemical Vapor Deposition) in which, for example, a gas mixture of silane ($SiH_4$) and propane ($C_3H_8$) is used as a source material gas, and, for example, a hydrogen gas ($H_2$) is used as a carrier gas. Here, for example, nitrogen (N) or phosphorus (P) is preferably introduced as an impurity.

Figure 5:
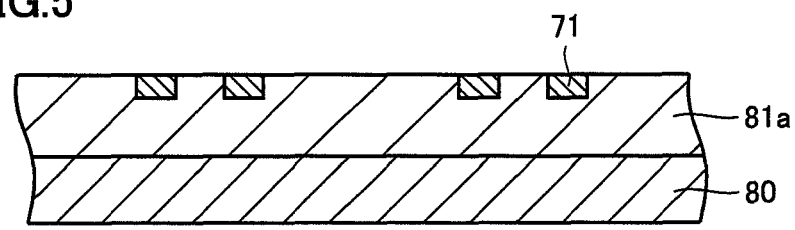
FIG. 5 is a partial cross-sectional view schematically showing a second step in the method for manufacturing the silicon carbide semiconductor device in FIG. 1.

As shown in FIG. 5, relaxing region 71 having the p-type is formed in a part of lower drift layer 81. Specifically, acceptor ions (impurity ions for providing the second conductivity type) are implanted into lower drift layer 81a with the use of an implantation mask (not shown).

Figure 6:
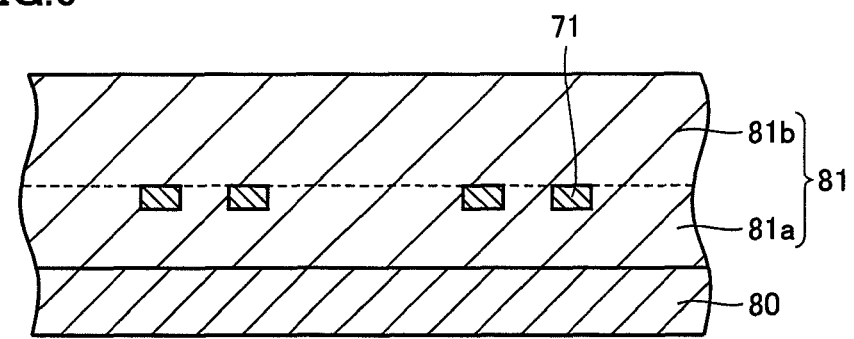
FIG. 6 is a partial cross-sectional view schematically showing a third step in the method for manufacturing the silicon carbide semiconductor device in FIG. 1.

As shown in FIG. 6, after relaxing region 71 is formed, upper drift layer 81b having the n-type is formed on lower drift layer 81a. Thus, relaxing region 71 is embedded in n drift layer 81 formed from lower drift layer 81a and upper drift layer 81b. Upper drift layer 81b can be formed with a method the same as the method of forming lower drift layer 81a.

Figure 7:
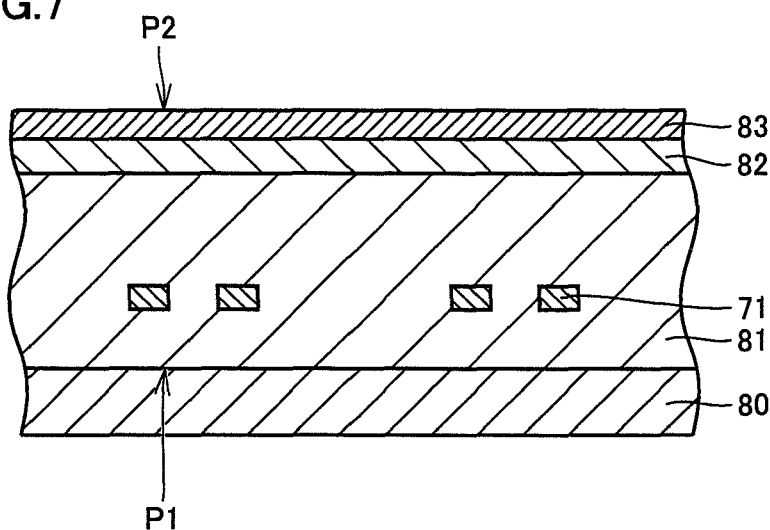
FIG. 7 is a partial cross-sectional view schematically showing a fourth step in the method for manufacturing the silicon carbide semiconductor device in FIG. 1.
Figure 8:
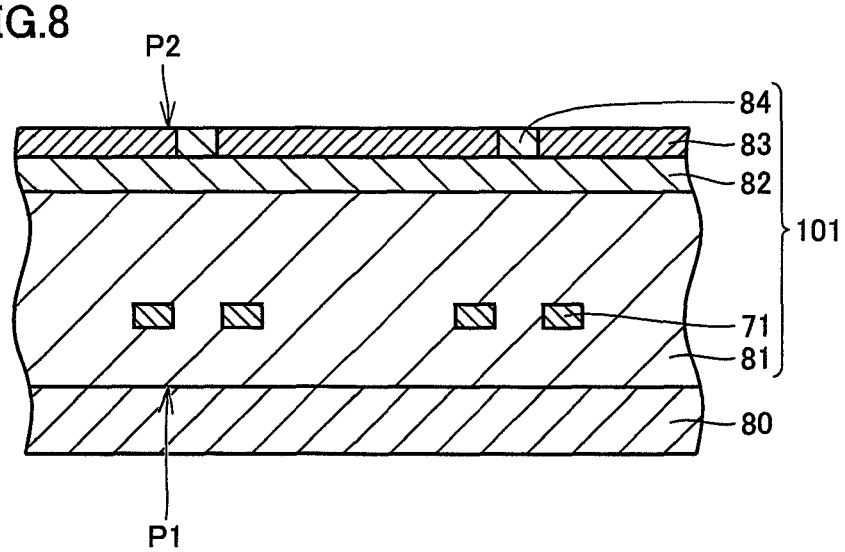
FIG. 8 is a partial cross-sectional view schematically showing a fifth step in the method for manufacturing the silicon carbide semiconductor device in FIG. 1.

As shown in FIG. 7, p body layer 82 and n region 83 are formed on n drift layer 81. As shown in FIG. 8, p contact region 84 is formed on p body layer 82. Formation thereof can be achieved, for example, by ion implantation into n drift layer 81 (FIG. 6). In ion implantation for forming p body layer 82 and contact region 84, ions of an impurity for providing the p-type such as aluminum (Al) are implanted. Alternatively, in ion implantation for forming n region 83, ions of an impurity for providing the n-type such as phosphorus (P) are implanted. It is noted that epitaxial growth accompanying addition of an impurity may be employed instead of ion implantation.

N drift layer 81, p body layer 82, n region 83, p contact region 84, and relaxing region 71 constitute epitaxial layer 101 having lower surface P1 and upper surface P2. N drift layer 81 forms lower surface P1 and n region 83 forms upper surface P2.

Then, heat treatment for activating an impurity is performed. A temperature for this heat treatment is preferably not lower than 1500° C. and not higher than 1900° C. and it is set, for example, to approximately 1700° C. A time period for heat treatment is set, for example, to approximately 30 minutes. An atmosphere for heat treatment is preferably an inert gas atmosphere, and for example, an Ar atmosphere is adopted.

Figure 9:
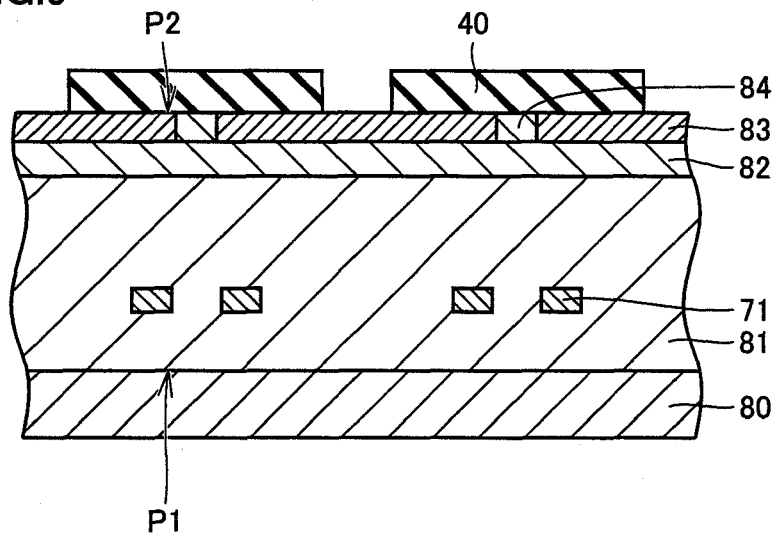
FIG. 9 is a partial cross-sectional view schematically showing a sixth step in the method for manufacturing the silicon carbide semiconductor device in FIG. 1.

As shown in FIG. 9, a mask layer 40 having an opening is formed on a surface formed by n region 83 and p contact region 84. For example, a silicon oxide film or the like can be employed as mask layer 40. The opening is formed in correspondence with a position of trench TR (FIG. 1).

Figure 10:
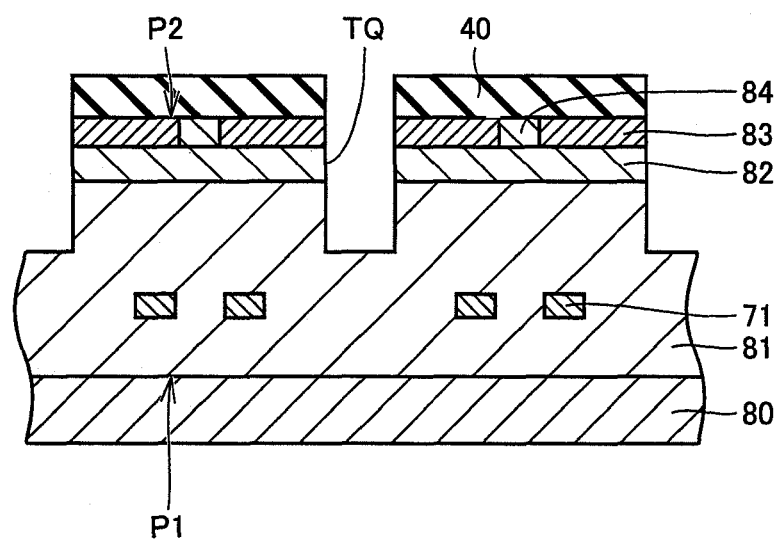
FIG. 10 is a partial cross-sectional view schematically showing a seventh step in the method for manufacturing the silicon carbide semiconductor device in FIG. 1.

As shown in FIG. 10, in the opening in mask layer 40, n region 83, p body layer 82, and a part of n drift layer 81 are etched away. As an etching method, for example, reactive ion etching (RIE), in particular inductively coupled plasma (ICP) RIE, can be employed. Specifically, ICP-RIE using, for example, $SF_6$ or a gas mixture of $SF_6$ and $O_2$ as a reaction gas can be employed. Through such etching, a recess TQ having a sidewall substantially perpendicular to upper surface P2 is formed in a region where trench TR (FIG. 1) should be formed.

Then, thermal etching is performed in recess TQ. Thermal etching can be performed, for example, through heating in an atmosphere containing a reactive gas having at least one or more types of halogen atoms. At least one or more types of halogen atoms include at least any of chlorine (Cl) atoms and fluorine (F) atoms. This atmosphere is, for example, of $Cl_2$, $BCL_3$, $SF_6$, or $CF_4$. Thermal etching is performed in such a manner that, for example, a gas mixture of a chlorine gas and an oxygen gas is used as a reaction gas and a temperature for heat treatment, for example, not lower than 700° C. and not higher than 1000° C. is set.

It is noted that the reaction gas may contain a carrier gas in addition to the chlorine gas and the oxygen gas described above. For example, a nitrogen ($N_2$) gas, an argon gas, a helium gas, or the like can be employed as a carrier gas. Then, in a case where a temperature for heat treatment not lower than 700° C. and not higher than 1000° C. is set as described above, a rate of etching SiC attains, for example, to approximately 70 μm/hour. In addition, in this case, since mask layer 40 made of silicon oxide is extremely high in rate of selective etching of SiC, it is not substantially etched during etching of SiC.

Figure 11:
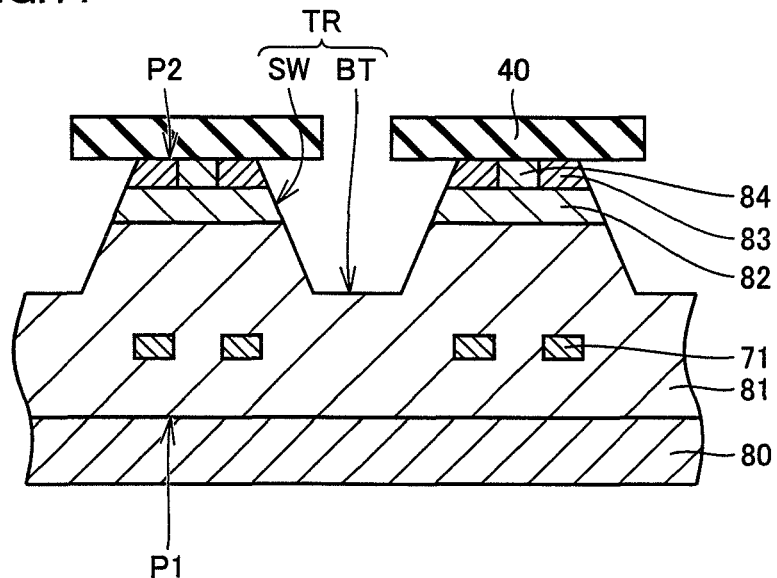
FIG. 11 is a partial cross-sectional view schematically showing an eighth step in the method for manufacturing the silicon carbide semiconductor device in FIG. 1.

As shown in FIG. 11, through thermal etching above, trench TR is formed in upper surface P2 of epitaxial layer 101. Trench TR has sidewall surface SW passing through n region 83 and p body layer 82 to reach n drift layer 81 and bottom surface BT located on n drift layer 81. Each of sidewall surface SW and bottom surface BT is distant from relaxing region 71. Preferably, at the time of formation of trench TR, self-formation of a special surface on sidewall surface SW, in particular on p body layer 82, takes place. Then, mask layer 40 is removed with any method such as etching.

Figure 12:
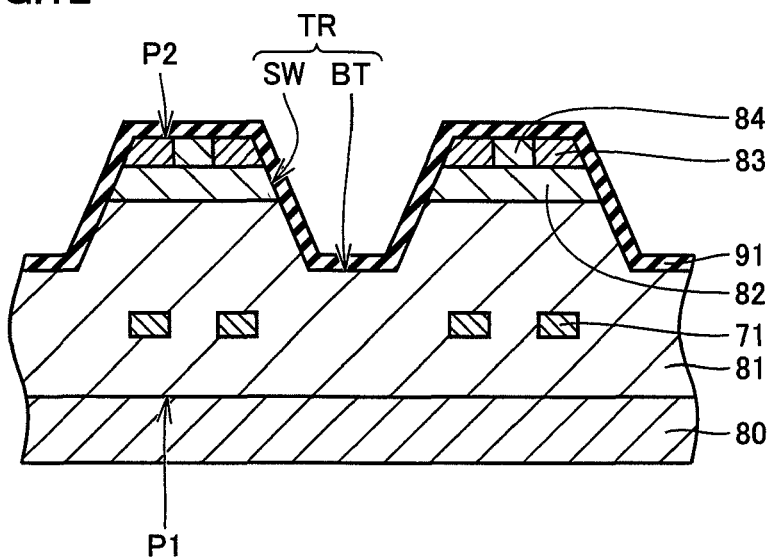
FIG. 12 is a partial cross-sectional view schematically showing a ninth step in the method for manufacturing the silicon carbide semiconductor device in FIG. 1.

As shown in FIG. 12, gate oxide film 91 covering each of sidewall surface SW and bottom surface BT of trench TR is formed. Gate oxide film 91 can be formed, for example, through thermal oxidation. Thereafter, NO annealing using a nitrogen monoxide (NO) gas as an atmospheric gas may be performed. A temperature profile has a condition, for example, of a temperature not lower than 1100° C. and not higher than 1300° C. and a retention time period around 1 hour. Thus, nitrogen atoms are introduced in an interface region between gate oxide film 91 and p body layer 82. Consequently, formation of interface state at the interface region is suppressed, so that channel mobility can be improved. It is noted that, if such nitrogen atoms can be introduced, a gas other than the NO gas may be employed as an atmospheric gas. After this NO annealing, Ar annealing using argon (Ar) as an atmospheric gas may further be performed. A heating temperature in Ar annealing is preferably higher than a heating temperature in NO annealing above and lower than a melting point of gate oxide film 91. A time period during which this heating temperature is retained is set, for example, to approximately 1 hour. Thus, formation of interface state at the interface region between gate oxide film 91 and p body layer 82 is further suppressed. It is noted that other inert gases such as a nitrogen gas may be employed as an atmospheric gas instead of the Ar gas.

Figure 13:
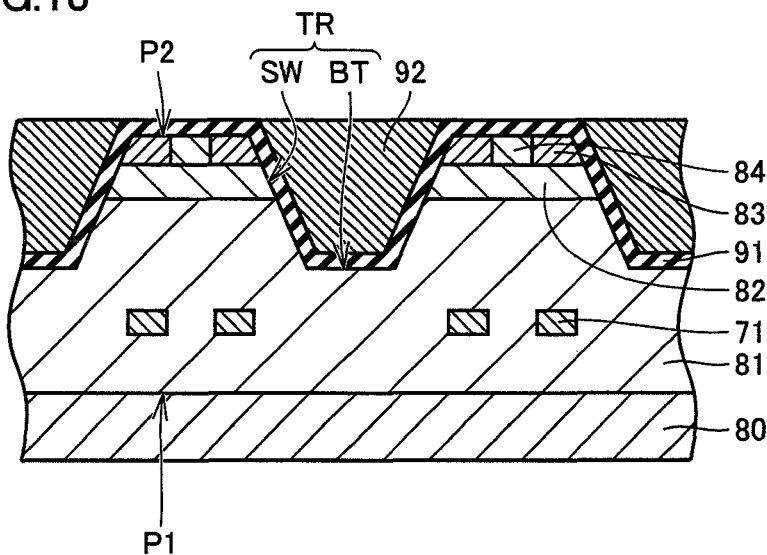
FIG. 13 is a partial cross-sectional view schematically showing a tenth step in the method for manufacturing the silicon carbide semiconductor device in FIG. 1.

As shown in FIG. 13, gate electrode 92 is formed on gate oxide film 91. Specifically, gate electrode 92 is formed on gate oxide film 91 so as to bury a region inside trench TR with gate oxide film 91 being interposed. A method of forming gate electrode 92 can be performed, for example, by forming a film of a conductor or doped polysilicon and CMP (Chemical Mechanical Polishing).

Figure 14:
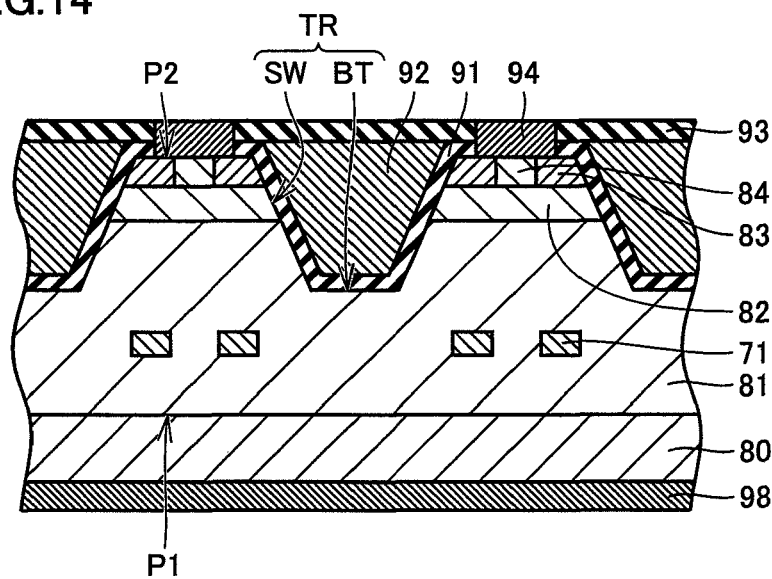
FIG. 14 is a partial cross-sectional view schematically showing an eleventh step in the method for manufacturing the silicon carbide semiconductor device in FIG. 1.

Referring to FIG. 14, interlayer insulating film 93 is formed on gate electrode 92 and gate oxide film 91 so as to cover an exposed surface of gate electrode 92. Etching is performed to form an opening in interlayer insulating film 93 and gate oxide film 91. This opening exposes each of n region 83 and p contact region 84 at upper surface P2. Then, source electrode 94 in contact with each of n region 83 and n contact region 84 is formed on upper surface P2. Drain electrode 98 is formed on lower surface P1 formed from n drift layer 81, with single crystal substrate 80 being interposed.

Referring again to FIG. 1, source interconnection layer 95 is formed. Thus, MOSFET 201 is obtained.

According to the present embodiment, MOSFET 201 is a trench-structure silicon carbide semiconductor device. In this case, in ensuring a breakdown voltage, electric field applied to gate oxide film 91 should be suppressed. MOSFET 201 having the features above can realize such suppression. Details of functions and effects will be described below.

As shown in FIG. 1, relaxing region 71 representing an electric field relaxing structure is distant from sidewall surface SW of trench TR. Thus, influence by the electric field relaxing structure on a channel structure can be lessened. In addition, relaxing region 71 is spaced apart from p body layer 82 by n drift layer 81. Namely, relaxing region 71 is embedded in n drift layer 81. Thus, relaxing region 71 can readily be provided at a sufficiently deep position. Therefore, the electric field relaxing structure sufficiently having an effect can readily be provided.

In addition, impurity dose amount $D_{rx}$ in relaxing region 71 is increased to satisfy relation of $D_{rx} > L_d \cdot N_d$. Thus, when a voltage across drain electrode 98 and source electrode 94 is higher as MOSFET 201 is set to the OFF state, relaxing region 71 is prevented from being completely depleted before a depletion layer sufficiently extends from relaxing region 71 to lower surface P1 of epitaxial layer 101. Thus, a depletion layer having a sufficient length can be formed between relaxing region 71 and lower surface P1. Therefore, a ratio of a voltage across drain electrode 98 and source electrode 94 borne by a portion between relaxing region 71 and lower surface P1 is increased. In other words, a voltage borne by a portion shallower than relaxing region 71 (an upper portion in FIG. 1) is mitigated. Thus, electric field intensity in a portion shallower than relaxing region 71 can be lessened. In other words, electric field intensity in a portion where breakdown is likely due to electric field concentration can be lessened. Thus, a higher voltage can be applied across drain electrode 98 and source electrode 94 without causing breakdown. Namely, a breakdown voltage of MOSFET 201 is raised.

In addition, electrical connection between lower drift layer 81a and drain electrode 98 to each other can be made with single crystal substrate 80 having an impurity concentration higher than impurity concentration $N_d$ being interposed. Therefore, contact resistance of drain electrode 98 can be lower. Therefore, electrical resistance of n drift layer 81 can accordingly be higher. Therefore, an impurity concentration in n drift layer 81 can further be lower. Thus, a breakdown voltage of MOSFET 201 can further be raised.

Preferably, relation of $L_d \geq 5$ μm is satisfied. Thus, a depletion layer having a length of 5 μm at the maximum can be formed between relaxing region 71 and lower surface P1. In other words, a depletion layer having a sufficient length can more reliably be formed between relaxing region 71 and lower surface P1. Therefore, a breakdown voltage of MOSFET 201 can further be raised.

Preferably, relation of $D_{rx} \geq 1 \times 10^{13}$ cm$^{-2}$ is satisfied. Thus, when a voltage across drain electrode 98 and source electrode 94 is higher as MOSFET 201 is set to the OFF state, relaxing region 71 is prevented from being completely depleted before a depletion layer sufficiently extends from relaxing region 71 to lower surface P1 of epitaxial layer 101. Therefore, a breakdown voltage of MOSFET 201 can further be raised.

Preferably, a breakdown voltage across drain electrode 98 and source electrode 94 is not lower than 600 V. In a semiconductor device having a breakdown voltage not lower than 600 V, it is a more important issue to ensure a breakdown voltage. MOSFET 201 having the features above can solve this issue.

Preferably, a distance between relaxing region 71 and bottom surface BT of trench TR, in particular distance $L_{tr}$ between relaxing region 71 and the corner portion of trench TR, is not greater than 4 μm. Thus, electric field concentration at gate oxide film 91 on bottom surface BT of trench TR can more effectively be suppressed. Therefore, a breakdown voltage of MOSFET 201 can further be raised.

In addition, as shown in FIG. 1, relaxing region 71 is provided at a position deeper than a position of bottom surface BT of trench TR. Thus, an effect of the electric field relaxing structure can further be enhanced.

Moreover, as shown in FIG. 3, relaxing region 71 is arranged outside bottom surface BT of trench TR in a plan view. Thus, when MOSFET 201 is in the OFF state, a depletion layer extends from relaxing region 71 toward the corner portion of trench TR located at a periphery of bottom surface BT of trench TR. Therefore, an effect of the electric field relaxing structure can further be enhanced.

Figure 15:
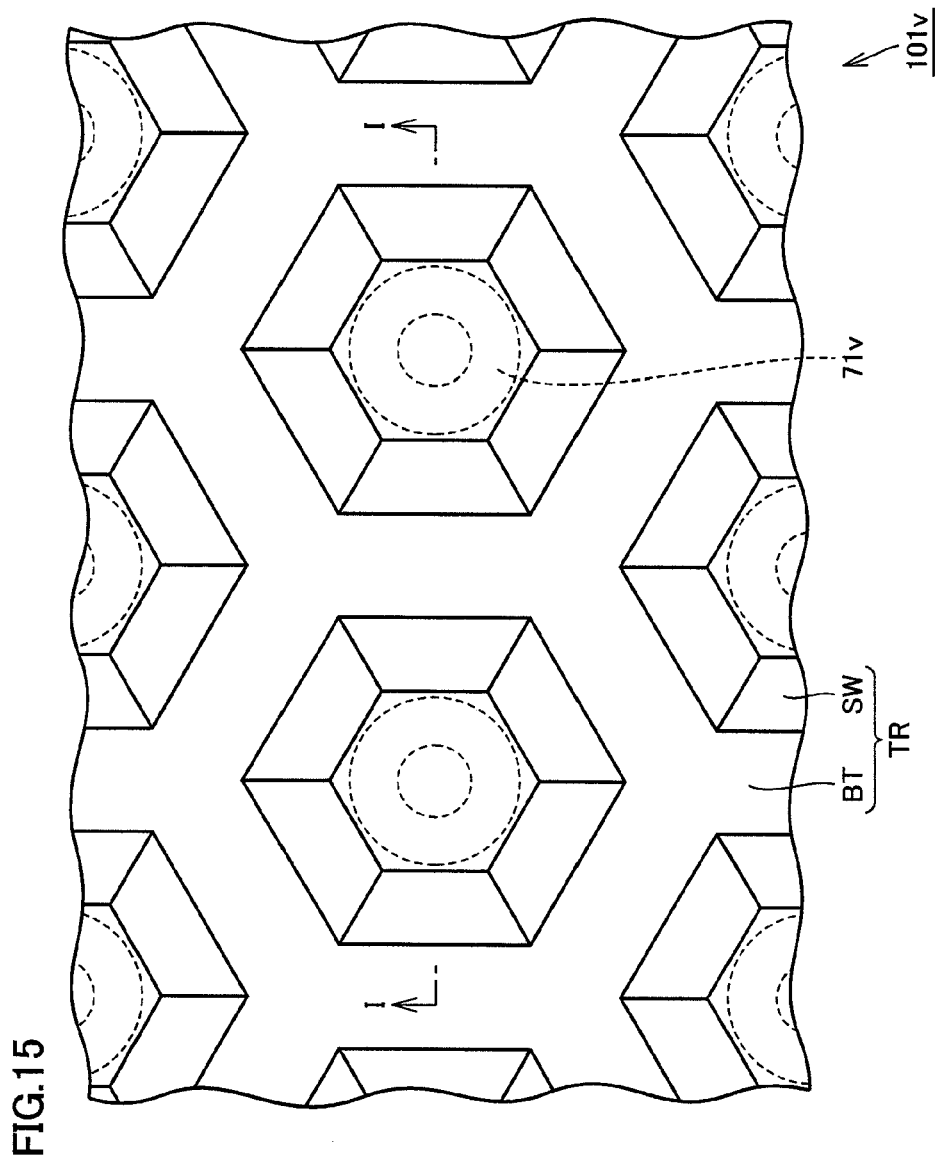
FIG. 15 is a partial top view schematically showing a first variation of the silicon carbide layer in FIG. 3.

It is noted that relaxing region 71 in epitaxial layer 101 has an outer periphery and an opening substantially similar to upper surface P2 having a hexagonal shape as described above. Namely, relaxing region 71 has hexagonal outer periphery and opening. An epitaxial layer including a relaxing region having a shape other than this, however, can also be employed. For example, as shown in FIG. 15, an epitaxial layer 101v including relaxing region 71 having an annular shape in a plan view may be employed. Alternatively, a relaxing region having quadrangular outer periphery and opening (not shown) may be employed.

Figure 16:
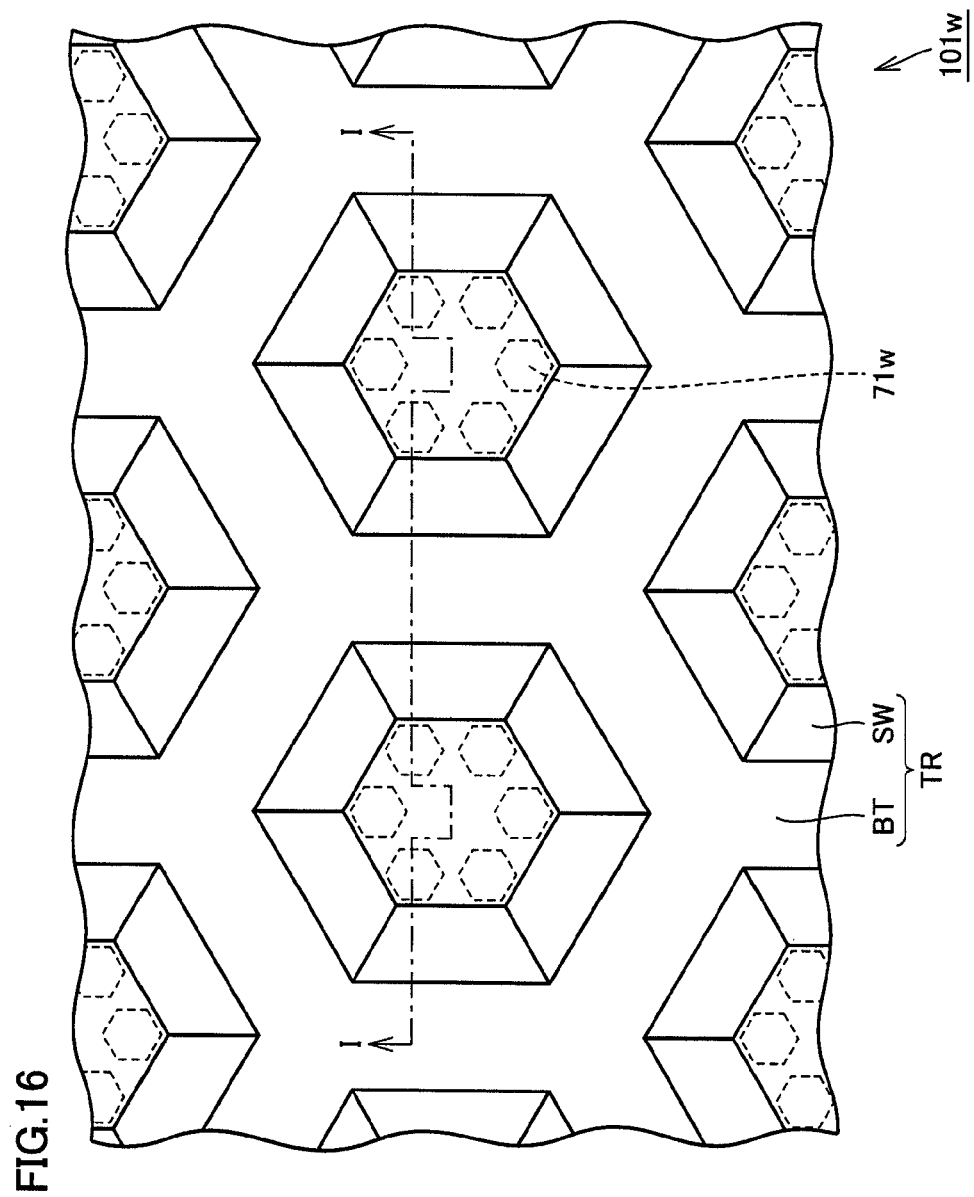
FIG. 16 is a partial top view schematically showing a second variation of the silicon carbide layer in FIG. 3.

Alternatively, for example as shown in FIG. 16, an epitaxial layer 101*w* having a relaxing region 71*w* arranged at a position corresponding to each of six corners of upper surface P2 having a hexagonal shape may be employed. Though all corners are provided with respective relaxing regions in FIG. 16, for example, relaxing regions may be provided at positions corresponding to some of six corners of upper surface P2 having the hexagonal shape.

Second Embodiment

Figure 17:
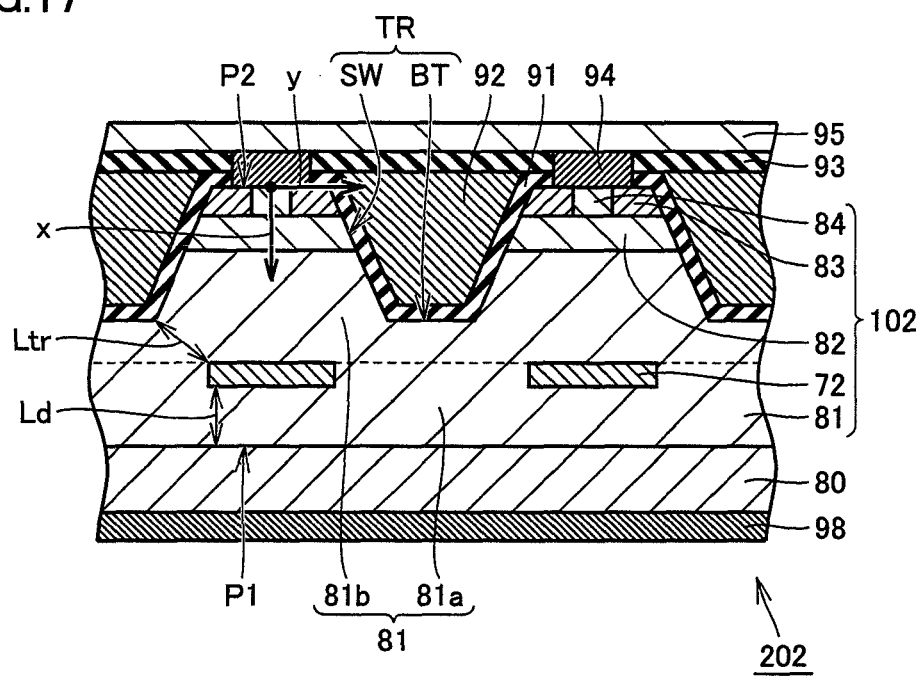
FIG. 17 is a partial cross-sectional view schematically showing a construction of a silicon carbide semiconductor device in a second embodiment of the present invention.
Figure 18:
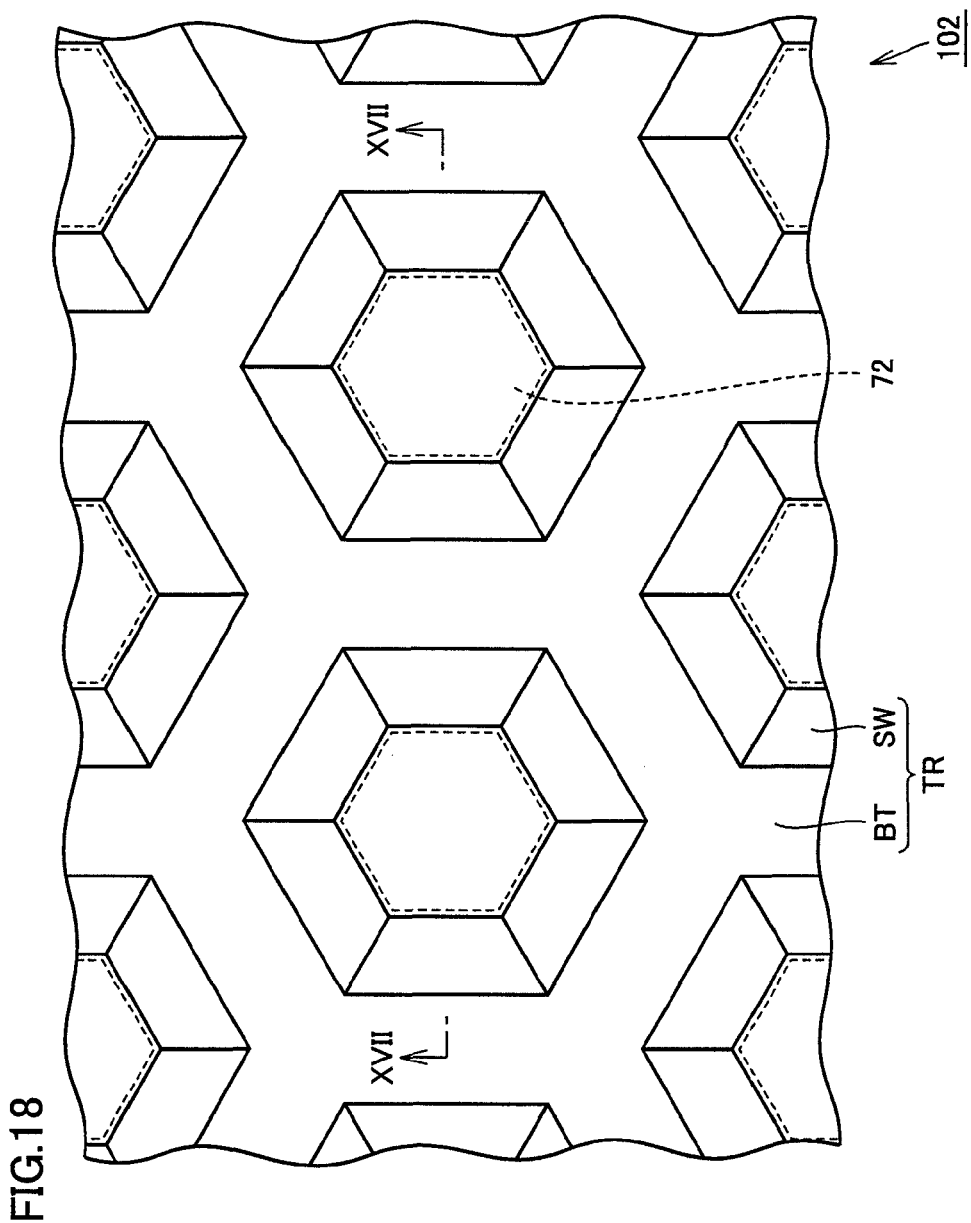
FIG. 18 is a partial top view schematically showing a shape of a silicon carbide layer in the silicon carbide semiconductor device in FIG. 17.

Referring to FIG. 17, a MOSFET 202 in the present embodiment has an epitaxial layer 102 instead of epitaxial layer 101 in the first embodiment. Epitaxial layer 102 has a relaxing region 72. Relaxing region 72 has a shape from which an opening in relaxing region 71 (FIG. 3) has been eliminated in a plan view (FIG. 18). Namely, relaxing region 72 has a shape similar to the hexagonal shape of upper surface P2 in a plan view. It is noted that features other than the above are substantially the same as those in the first embodiment described above, and therefore the same or corresponding elements have the same reference characters allotted and description thereof will not be repeated.

Third Embodiment

Figure 19:
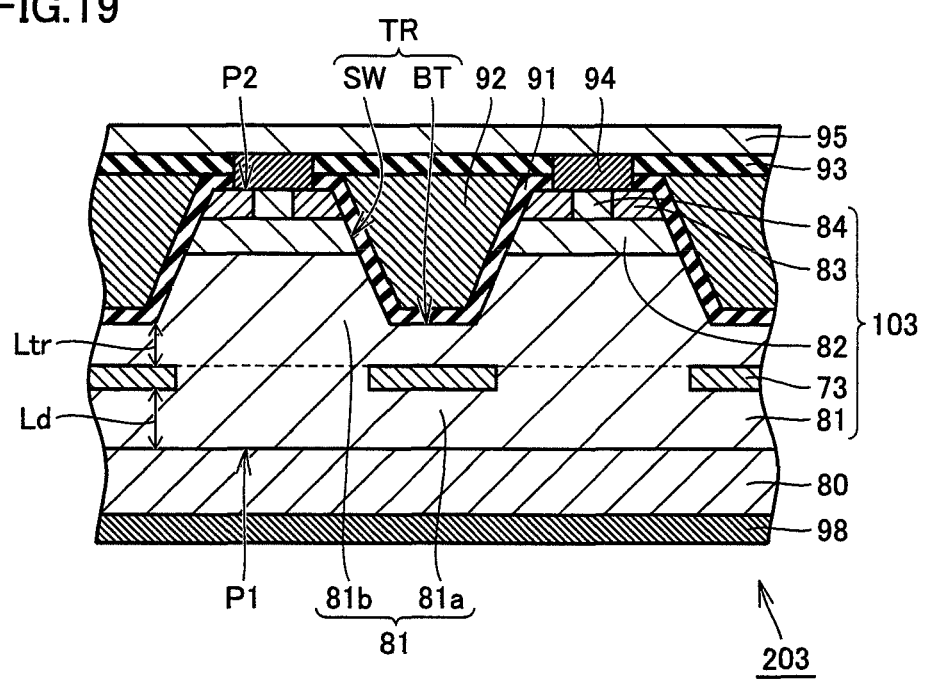
FIG. 19 is a partial cross-sectional view schematically showing a construction of a silicon carbide semiconductor device in a third embodiment of the present invention.
Figure 20:
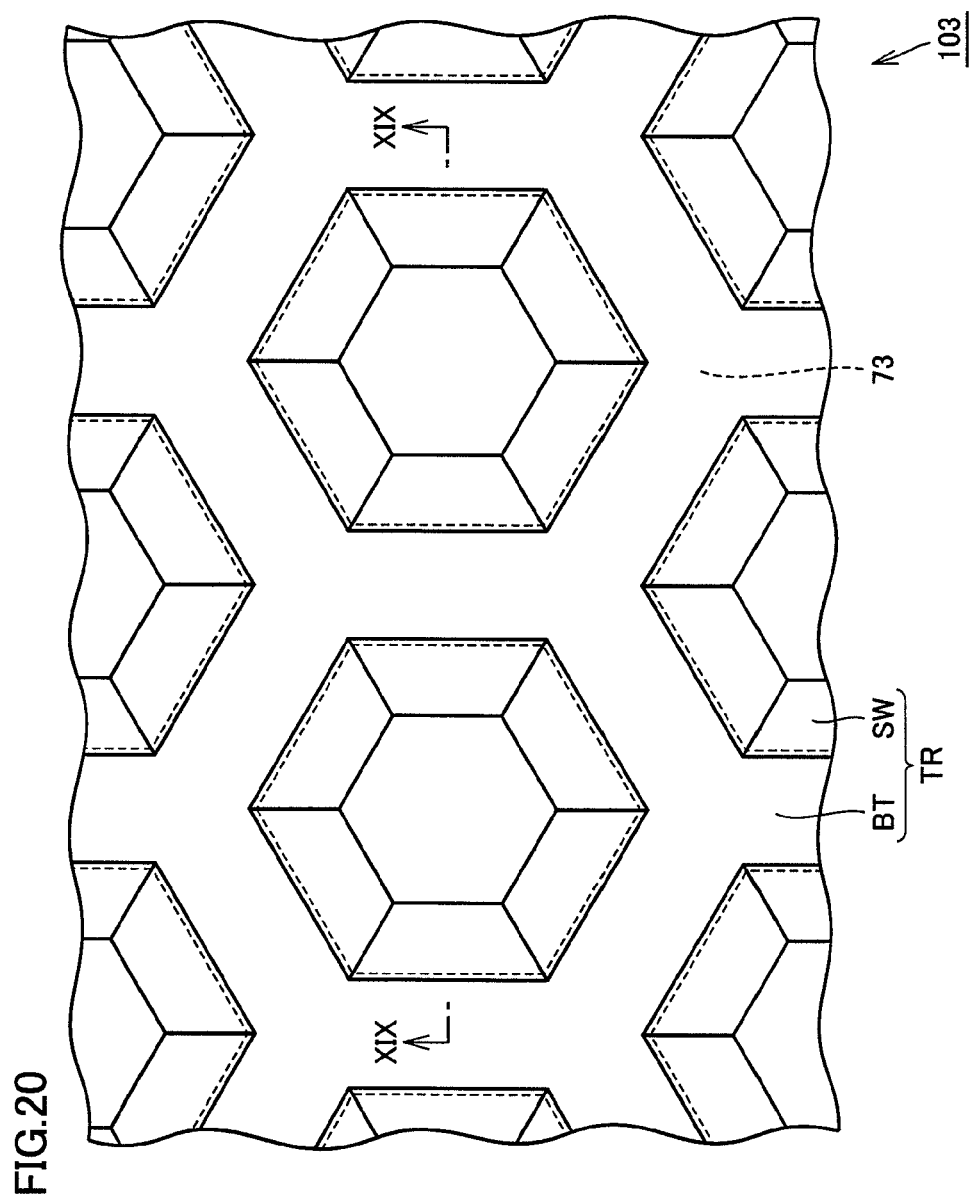
FIG. 20 is a partial top view schematically showing a shape of a silicon carbide layer in the silicon carbide semiconductor device in FIG. 19.

Referring to FIG. 19, a MOSFET 203 in the present embodiment has an epitaxial layer 103 instead of epitaxial layer 101 in the first embodiment. Epitaxial layer 103 has a relaxing region 73. Relaxing region 73 extends along trench TR in a plan view (FIG. 20). It is noted that features other than the above are substantially the same as those in the first embodiment described above, and therefore the same or corresponding elements have the same reference characters allotted and description thereof will not be repeated.

Then, intensity of electric field in a direction of thickness (a vertical direction in FIG. 19) applied to gate oxide film 91 at a position lying between n drift layer 81 and the corner portion of trench TR while MOSFET 203 is in the OFF state (hereinafter referred to as corner portion electric field intensity) was simulated. Consequently, corner portion electric field intensity of MOSFET 203 having relaxing region 73 was 5.7 MV/cm. In contrast, in a comparative example not having a relaxing region, corner portion electric field intensity was 7.8 MV/cm. Namely, owing to relaxing region 73, corner portion electric field intensity decreased from 7.8 MV/cm to 5.7 MV/cm.

It is noted that, in this simulation, an impurity concentration in n drift layer 81 was set to $8 \times 10^{15}$ cm$^{-3}$, a voltage of drain electrode 98 with reference to source interconnection layer 95 was set to 600 V, a depth of trench TR was set to 1.65 µm, a position of relaxing region 73 was set to 5-µm depth from upper surface P2, aluminum was adopted as an impurity in relaxing region 73, a width of relaxing region 73 (a dimension in a lateral direction in FIG. 19) was set to 2 µm, acceleration energy during formation of relaxing region 73 was set to 100 keV, and a dose amount during formation of relaxing region 73 was set to $1 \times 10^{13}$ cm$^{-2}$.

In each embodiment above, in the plan view (FIGS. 3, 15, 16, 18, and 20), a structure of a relaxing region has a period corresponding to a period of a structure of trench TR. A structure of a relaxing region, however, may have another period. Alternatively, relaxing regions may randomly be arranged. Thus, in a case where a periodic structure or a random structure not corresponding to a periodic structure of trench TR is employed, an interval between relaxing regions is preferably not smaller than 2 µm and not greater than 5 µm.

By setting the interval to 2 µm or greater, influence by current confinement by the relaxing region can be lessened. In addition, by setting the interval to 5 µm or smaller, an effect of electric field relaxation achieved by the relaxing region can be sufficient. In a case where a periodic structure or a random structure not corresponding to a periodic structure of trench TR is employed, an implantation mask used during formation of a relaxing region can be formed without precise alignment.

Fourth Embodiment

Figure 21:
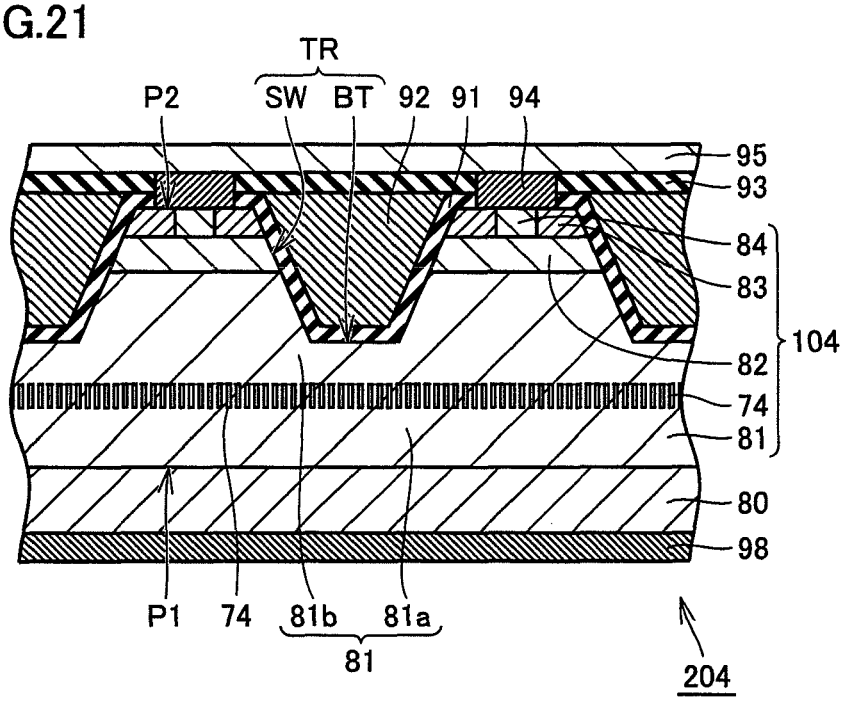
FIG. 21 is a partial cross-sectional view schematically showing a construction of a silicon carbide semiconductor device in a fourth embodiment of the present invention.
Figure 22:
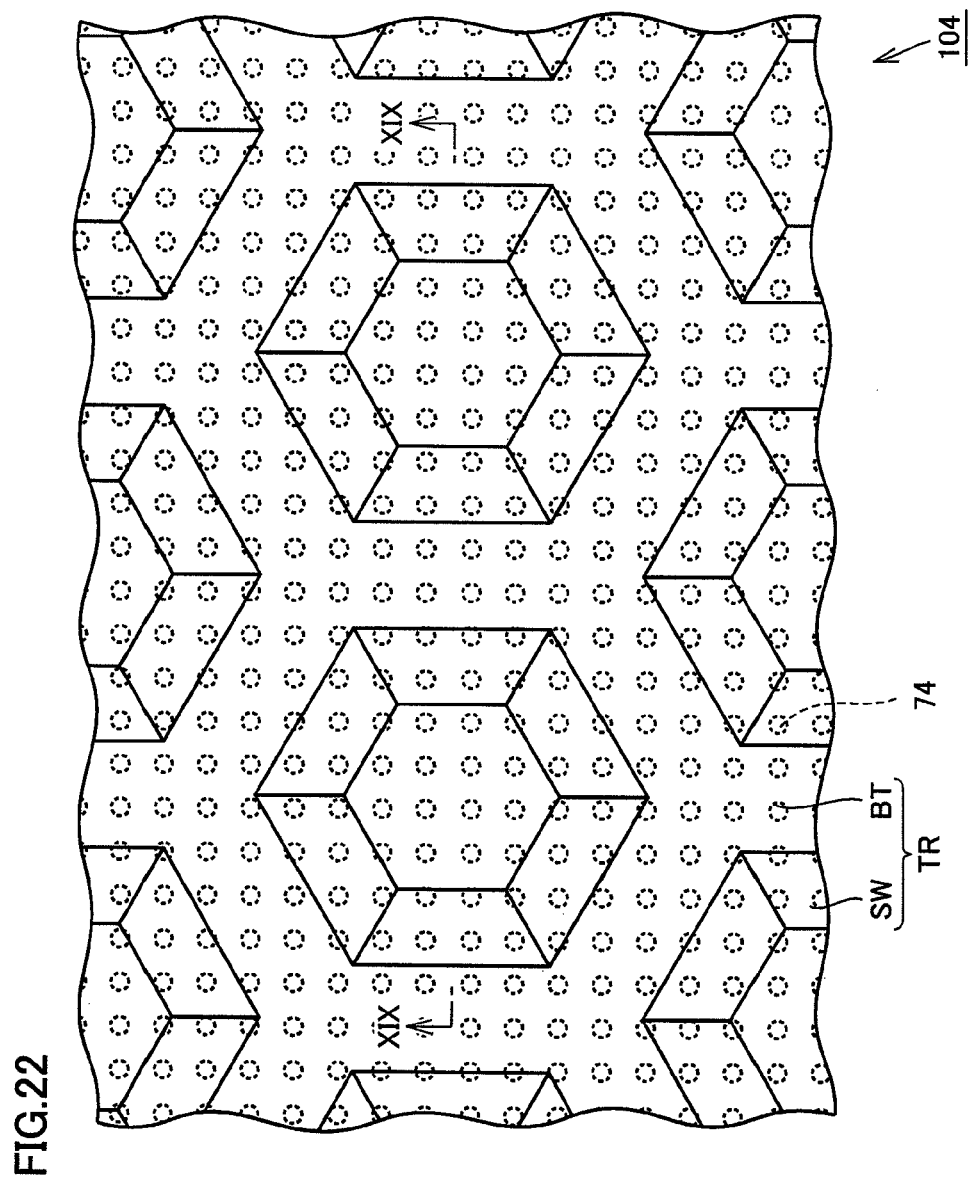
FIG. 22 is a partial top view schematically showing a shape of a silicon carbide layer in the silicon carbide semiconductor device in FIG. 21.

Referring to FIG. 21, a MOSFET 204 in the present embodiment has an epitaxial layer 104 instead of epitaxial layer 101 in the first embodiment. Epitaxial layer 104 has a relaxing region 74. Relaxing regions 74 are arranged as distributed in a plan view (FIG. 22).

It is noted that features other than the above are substantially the same as those in the first embodiment described above, and therefore the same or corresponding elements have the same reference characters allotted and description thereof will not be repeated.

According to the present embodiment, relaxing regions 74 can provide an electric field relaxing structure. In addition, since relaxing regions 74 can finely be distributed, regions where a current is cut off can also finely be distributed. Therefore, increase in ON resistance due to the electric field relaxing structure can be suppressed. In addition, since relaxing regions 74 can be formed without precise positioning, an easier manufacturing method can be provided.

(Special Surface)

Figure 23:
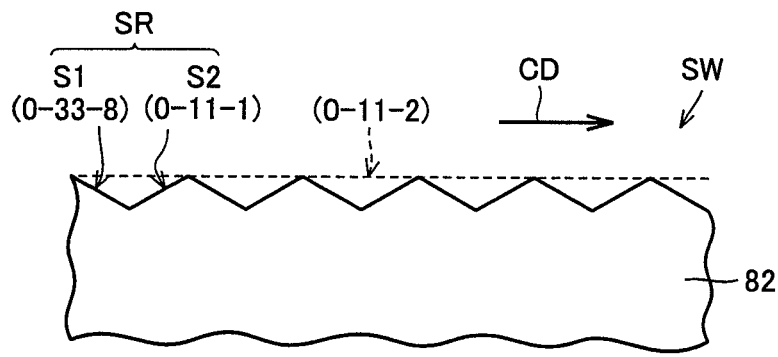
FIG. 23 is a partial cross-sectional view schematically showing a microstructure at a surface of a silicon carbide layer in a silicon carbide semiconductor device.

Sidewall surface SW described above has a special surface in particular in a portion on p body layer 82. Sidewall surface SW having the special surface includes a surface S1 (a first surface) having a plane orientation {0-33-8} as shown in FIG. 23. In other words, on sidewall surface SW of trench TR, p body layer 82 is provided with a surface including surface S1. Surface S1 preferably has a plane orientation (0-33-8).

More preferably, sidewall surface SW microscopically includes surface S1, and sidewall surface SW microscopically further includes a surface S2 (a second surface) having a plane orientation {0-11-1}. Here, "microscopic" means in detail to such an extent that a dimension about twice as large as interatomic spacing is at least taken into consideration. As a method of observing such a microscopic structure, for example, TEM (Transmission Electron Microscope) can be employed. Surface S2 preferably has a plane orientation (0-11-1).

Preferably, surface S1 and surface S2 of sidewall surface SW form a combined surface SR having a plane orientation {0-11-2}. Namely, combined surface SR is formed by periodic repetition of surfaces S1 and S2. Such a periodic structure can be observed, for example, with TEM or AFM (Atomic Force Microscopy). In this case, combined surface SR has an off angle of 62° macroscopically with respect to the {000-1} plane. Here, "macroscopic" means ignoring a microstructure having a dimension as small as interatomic spacing. For measuring such a macroscopic off angle, for example, a method with the use of general X-ray diffraction can be employed. Preferably, combined surface SR has a plane orientation (0-11-2). In this case, combined surface SR has an OFF angle of 62° macroscopically with respect to a (000-1) plane.

Preferably, a channel direction CD representing a direction in which carriers flow over a channel surface (that is, a direction of thickness of a MOSFET (the vertical direction in FIG. 1 and the like)) extends along a direction in which periodic repetition described above appears.

A detailed structure of combined surface SR will now be described.

Figure 24:
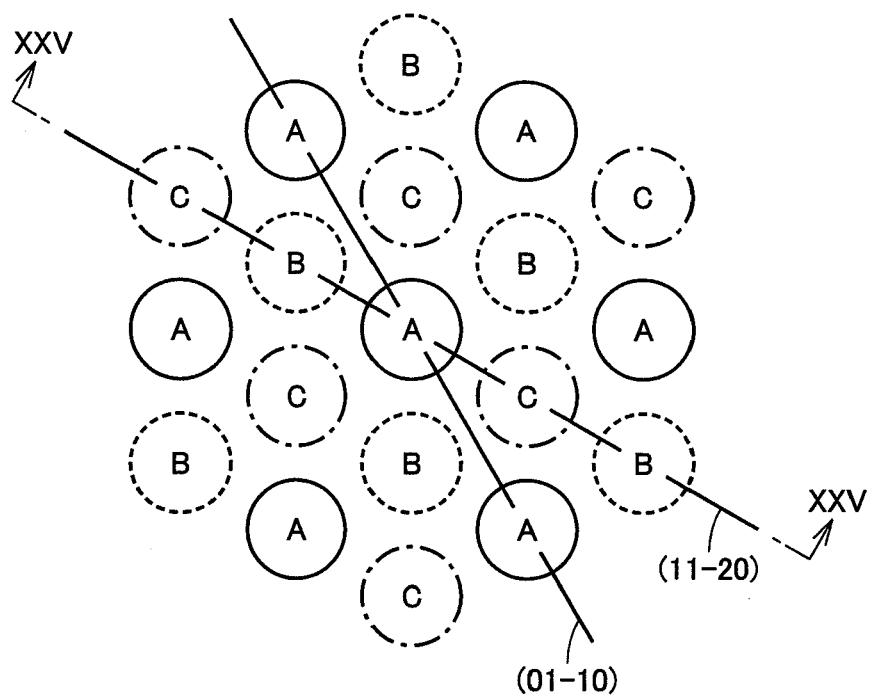
FIG. 24 is a diagram showing crystal structure at a (000-1) plane in a hexagonal crystal having a poly type of 4H.

In general, when silicon carbide single crystal of a poly type of 4H is viewed from the (000-1) plane, as shown in FIG. 24, Si atoms (or C atoms) are provided such that atoms in an A layer (a solid line in the figure), atoms in a B layer located thereunder (a dashed line in the figure), atoms in a C layer located thereunder (a chain dotted line in the figure), and atoms in the B layer located thereunder (not shown) are repeatedly provided. Namely, such a periodic stack structure as ABCBABCBABCB . . . with four layers of ABCB being defined as one period is provided.

Figure 25:
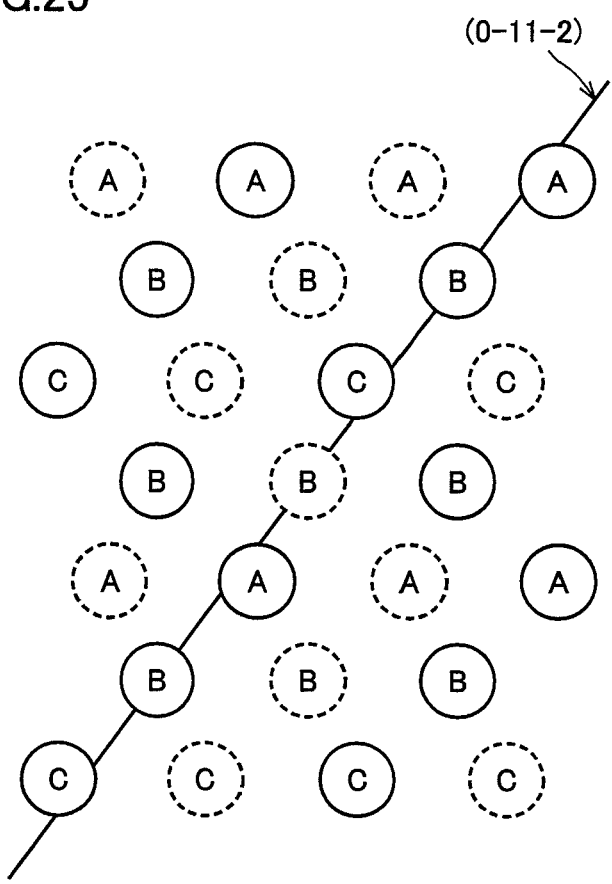
FIG. 25 is a diagram showing crystal structure at a (11-20) plane along the line XXV-XXV in FIG. 24.

As shown in FIG. 25, at a (11-20) plane (a cross-section along the line XXV-XXV in FIG. 24), atoms in each layer of four layers of ABCB forming one period described above are not aligned to completely extend along a (0-11-2) plane. FIG. 25 shows the (0-11-2) plane as it passes through positions of atoms in the B layer, and in this case, it can be seen that atoms in each of the A layer and the C layer are displaced from the (0-11-2) plane. Therefore, even though a macroscopic plane orientation of a surface of silicon carbide single crystal, that is, a plane orientation in a case where an atomic-level structure is ignored, is limited to (0-11-2), this surface can microscopically take various structures.

Figure 26:
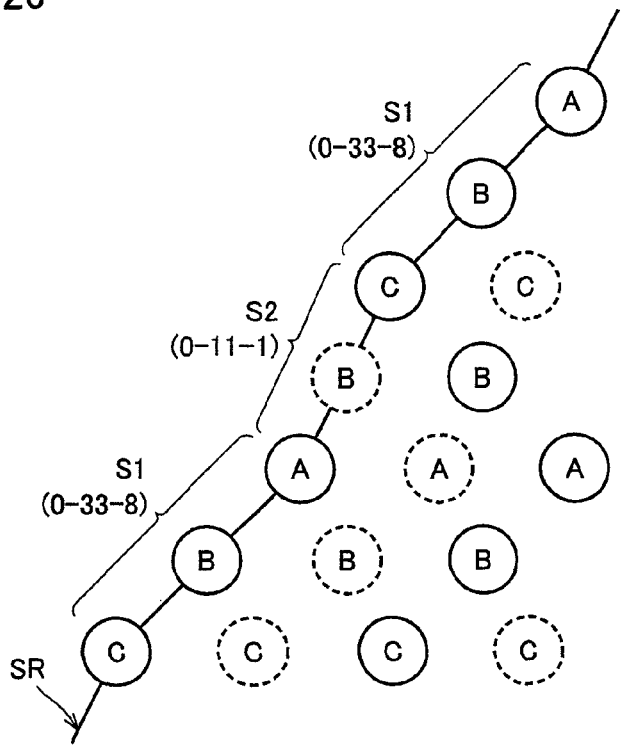
FIG. 26 is a diagram showing in a (11-20) plane, crystal structure in the vicinity of a surface of a combined surface in FIG. 23.

As shown in FIG. 26, combined surface SR is formed in such a manner that surface S1 having the plane orientation (0-33-8) and surface S2 connected to surface S1 and having a plane orientation different from the plane orientation of surface S1 are alternately provided. A length of each of surface S1 and surface S2 is twice as large as interatomic spacing of Si atoms (or C atoms). It is noted that a surface obtained by averaging surface S1 and surface S2 corresponds to the (0-11-2) plane (FIG. 25).

Figure 27:
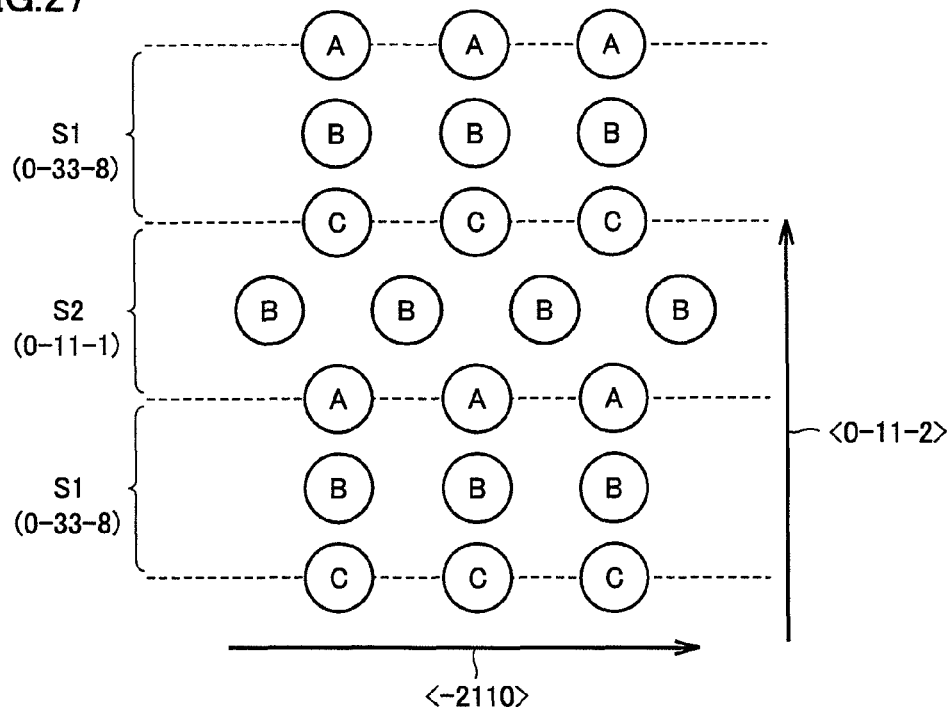
FIG. 27 is a diagram when the combined surface in FIG. 23 is viewed from a (01-10) plane.

As shown in FIG. 27, when combined surface SR is viewed from a (01-10) plane, single crystal structure periodically includes a structure equivalent to cubic crystal in part (a portion of surface S1). Specifically, combined surface SR is formed in such a manner that surface S1 having a plane orientation (001) in structure equivalent to the cubic crystal described above and surface S2 connected to surface S1 and having a plane orientation different from the plane orientation of surface S1 are alternately provided. Thus, it is also possible in a poly type other than 4H to form a surface from a surface having the plane orientation (001) in the structure equivalent to the cubic crystal (surface S1 in FIG. 24) and a surface connected to this surface and having a plane orientation different from this plane orientation (surface S2 in FIG. 24). The poly type may be, for example, 6H or 15R.

Figure 28:
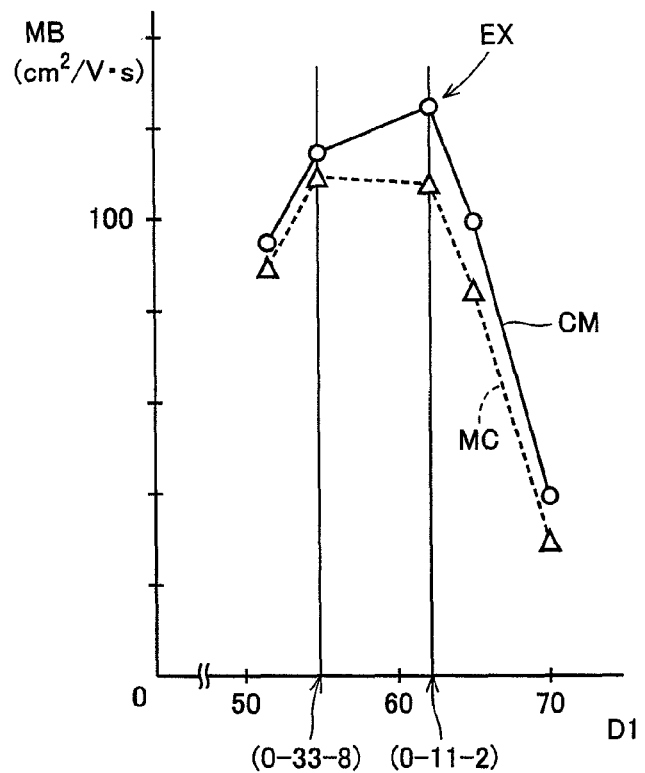
FIG. 28 is a graph showing one example of relation of a macroscopically viewed angle between a channel surface and a (000-1) plane with channel mobility, in each of a case where thermal etching is performed and a case where it is not performed.

Relation between a crystal plane of sidewall surface SW and mobility MB of a channel surface will now be described with reference to FIG. 28. In the graph in FIG. 28, the abscissa represents an angle D1 formed between a macroscopic plane orientation of sidewall surface SW having a channel surface and the (000-1) plane and the ordinate represents mobility MB. A plot group CM corresponds to a case where sidewall surface SW is finished as a special surface through thermal etching and a plot group MC corresponds to a case where such thermal etching is not performed.

Mobility MB in plot group MC was highest when a macroscopic plane orientation of the surface of the channel surface was set to (0-33-8). This may be because, in a case where thermal etching is not performed, that is, a microscopic structure of the channel surface is not particularly controlled, by setting a macroscopic plane orientation to (0-33-8), a ratio of formation of a microscopic plane orientation (0-33-8), that is, a plane orientation (0-33-8) in a case of considering even an atomic level, was probabilistically high.

On the other hand, mobility MB in plot group CM was highest when a macroscopic plane orientation of the surface of the channel surface was set to (0-11-2) (an arrow EX). This may be because, as a large number of surfaces S1 each having the plane orientation (0-33-8) are regularly and densely arranged with surface S2 being interposed as shown in FIGS. 26 and 27, a ratio occupied by the microscopic plane orientation (0-33-8) was high at the surface of the channel surface.

Figure 29:
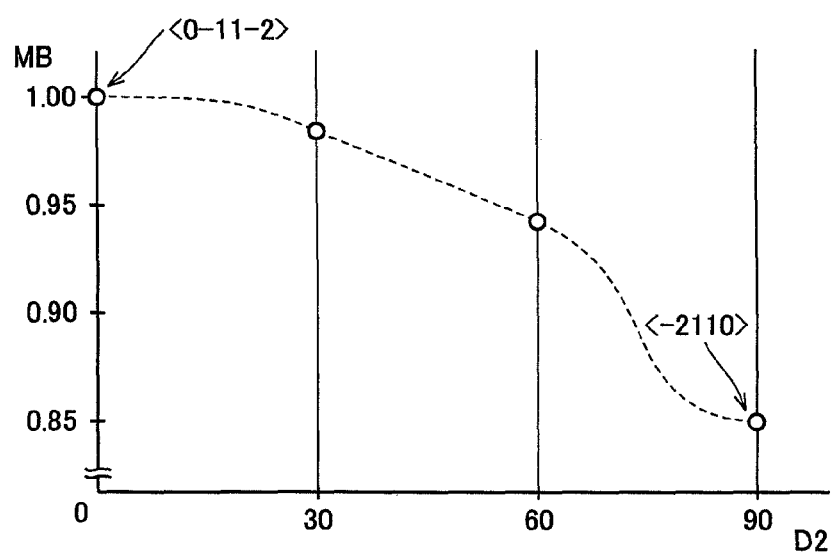
FIG. 29 is a graph showing one example of relation of an angle between a channel direction and a <0-11-2> direction with channel mobility.

It is noted that, on combined surface SR, mobility MB has orientation dependency. In the graph shown in FIG. 29, the abscissa represents an angle D2 between a channel direction and a <0-11-2> direction and the ordinate represents mobility MB (arbitrary unit) of the channel surface. A dashed line is supplementarily provided in order to facilitate viewing of the graph. It was found from this graph that, in order to increase channel mobility MB, angle D2 which channel direction CD (FIG. 23) has is preferably not smaller than 0° and not greater than 60° and more preferably substantially 0°.

Figure 30:
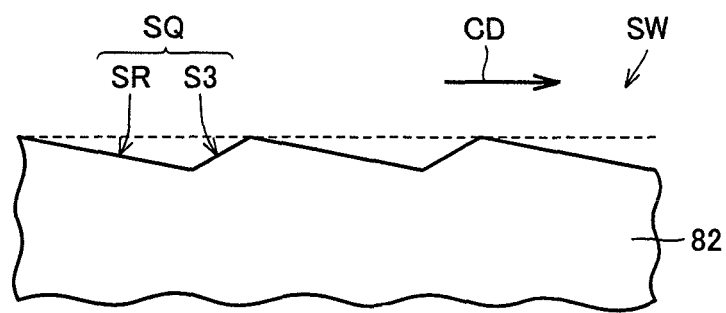
FIG. 30 is a diagram showing a variation of FIG. 23.

As shown in FIG. 30, sidewall surface SW may further include a surface S3 (a third surface) in addition to combined surface SR. More specifically, sidewall surface SW may include a combined surface SQ formed by periodic repetition of surface S3 and combined surface SR. In this case, an off angle of sidewall surface SW with respect to the {000-1} plane is deviated from 62° which is an ideal off angle of combined surface SR. This deviation is preferably small and preferably within a range of ±10°. A surface included in such a range of angles is exemplified by a surface having a macroscopic plane orientation of a {0-33-8} plane. More preferably, an off angle of sidewall surface SW with respect to the (000-1) plane is deviated from 62° which is an ideal off angle of combined surface SR. This deviation is preferably small and preferably within a range of ±10°. A surface included in such a range of angle is exemplified by a surface having a macroscopic plane orientation of a (0-33-8) plane.

Such a periodic structure can be observed, for example, with TEM or AFM.

Fifth Embodiment

Figure 31:
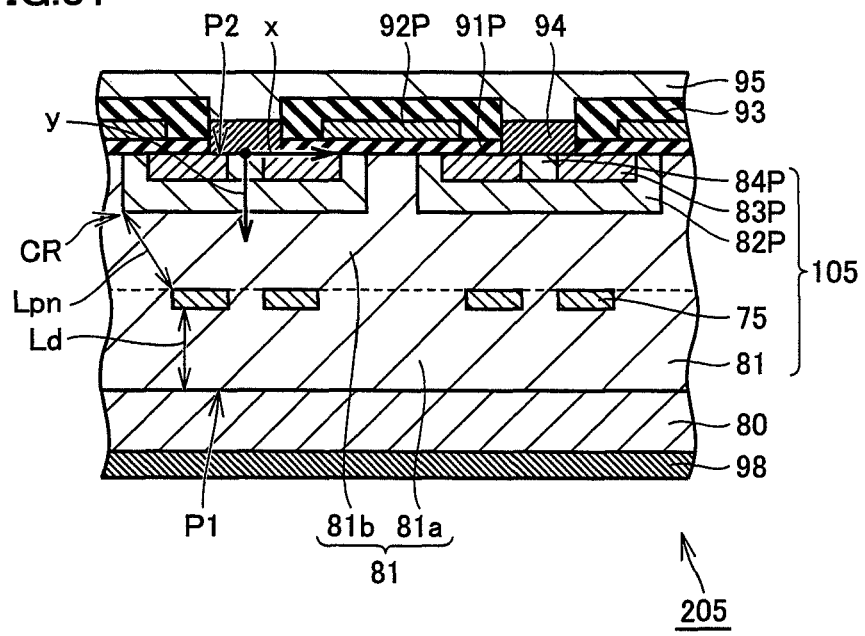
FIG. 31 is a partial cross-sectional view schematically showing a construction of a silicon carbide semiconductor device in a fifth embodiment of the present invention.

As shown in FIG. 31, a MOSFET 205 according to a variation of MOSFET 201 (FIG. 1) is of a planar structure. Upper surface P2 of an epitaxial layer 105 includes a flat surface having upper drift layer 81b, a p body region 82P (a body region), an n region 83P (a source region), and a p contact region 84P. A gate oxide film 91P (a gate insulating film) is provided on this flat surface. A gate electrode 92P is provided on gate oxide film 91P. P body region 82P is a well region having a side surface and a bottom surface as well as a corner portion CR between the side surface and the bottom surface. Preferably, a distance $L_{pn}$ between a relaxing region 75 and corner portion CR of the well region is not greater than 4 µm. The reason why distance $L_{pn} \leq 4$ µm is preferred is the same as the reason why distance $L_{tr} \leq 4$ µm is preferred in the first embodiment.

It is noted that features other than the above are substantially the same as those in the first embodiment described above, and therefore the same or corresponding elements have the same reference characters allotted and description thereof will not be repeated.

According to the present embodiment, as in the first embodiment, electric field intensity at a position where it is likely to be a factor determining a breakdown voltage is suppressed. Specifically, electric field intensity at a position where it is likely to be a factor determining a breakdown voltage in a planar-structure MOSFET is suppressed. More specifically, it is necessary to suppress electric field applied to an interface between n drift layer 81 and p body region 82P, and in particular, it is necessary to suppress electric field applied to corner portion CR. MOSFET 205 having the features above can realize such suppression.

It is noted that, in each embodiment above, the n-type is defined as the first conductivity type and the p-type is defined as the second conductivity type, however, these conductivity types may be interchanged. In this case, donors and acceptors in the description above are also interchanged. It is noted that, in order to obtain higher channel mobility, the n-type is preferably defined as the first conductivity type.

In addition, a silicon carbide semiconductor device does not necessarily have to have a single crystal substrate and a single crystal substrate may be omitted. In this case, for example, a first electrode may directly be provided on a first main surface of a silicon carbide layer. Thus, a silicon carbide semiconductor device can have a smaller thickness.

(Regarding Relation of Impurity Concentration $N_d$ and Distance $L_d$ With Breakdown Voltage)

Figure 32:
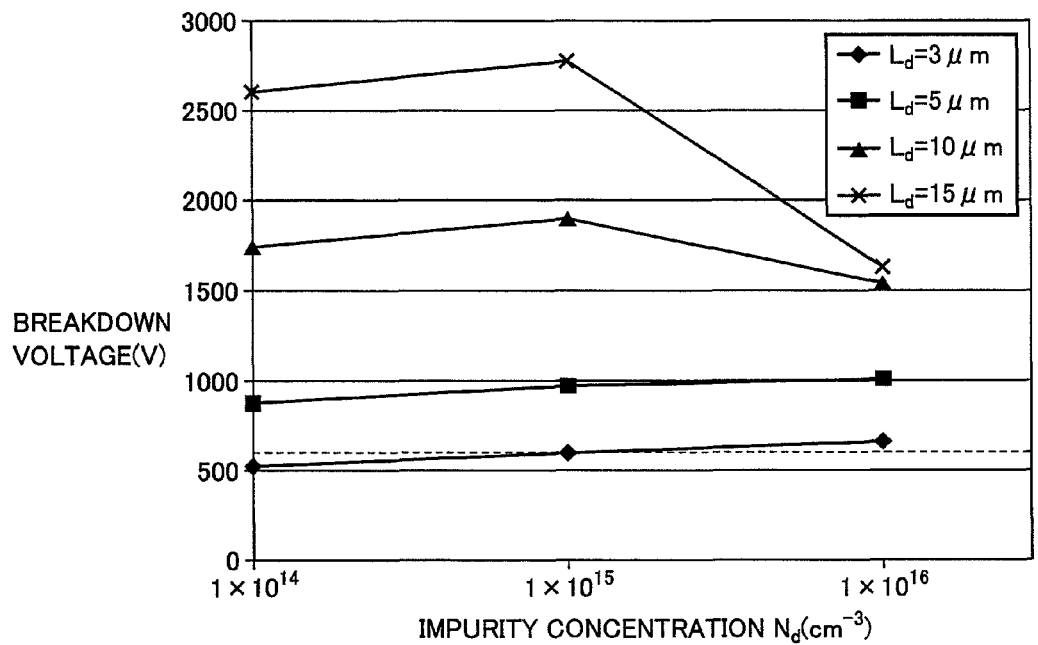
FIG. 32 is a graph exemplifying relation between impurity concentration $N_d$ in a drift layer and a breakdown voltage in each of cases where a distance $L_d$=3 μm, 5 μm, 10 μm, and 15 μm.

As shown in results of simulation in FIG. 32, when an impurity dose amount in the relaxing region is high enough not to cause complete depletion of the relaxing region (for example, relaxing region 71 in FIG. 1), a breakdown voltage at the interface between the relaxing region and the lower drift layer (for example, relaxing region 71 and lower drift layer 81a in FIG. 1) is mainly determined by impurity concentration $N_d$ in the lower drift layer and distance $L_d$ between the relaxing region and lower surface P1 (see, for example, FIG. 1). The upper limit of this breakdown voltage is around 600 V (see a dashed line in the figure) in a silicon semiconductor device. In a silicon carbide semiconductor device, a breakdown voltage not lower than 600 V was obtained in a case of $L_d \geq 5$ μm.

(Regarding Impurity Dose Amount $D_{rx}$)

Figure 33:
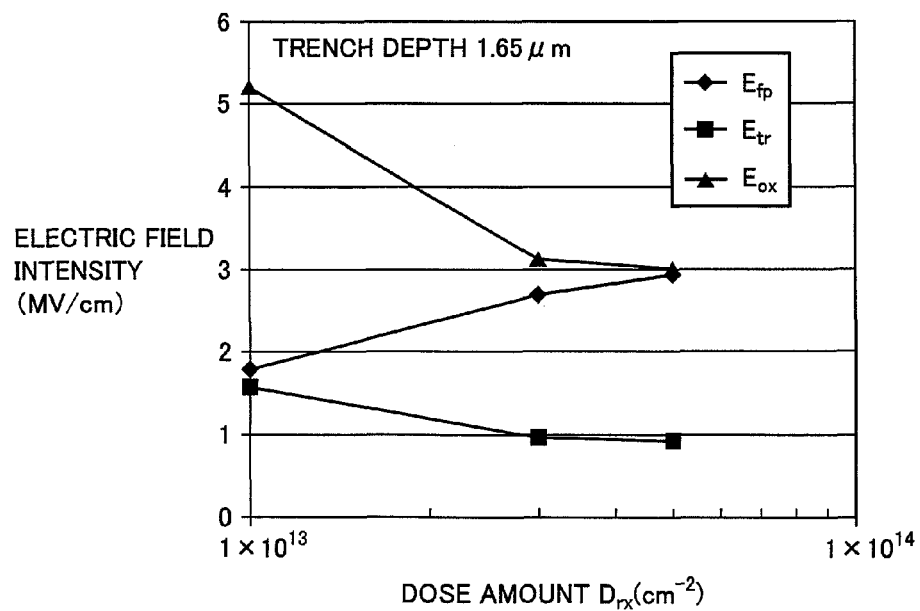
FIG. 33 is a graph exemplifying relation between an impurity dose amount $D_{rx}$ in a relaxing region and each of electric field intensity $E_{fp}$ applied to an interface between a drift layer and a relaxing region, electric field intensity $E_{tr}$ applied to the drift layer in a trench, and electric field intensity $E_{ox}$ applied to a gate insulating film in a case where a trench has a depth of 1.65 μm.
Figure 34:
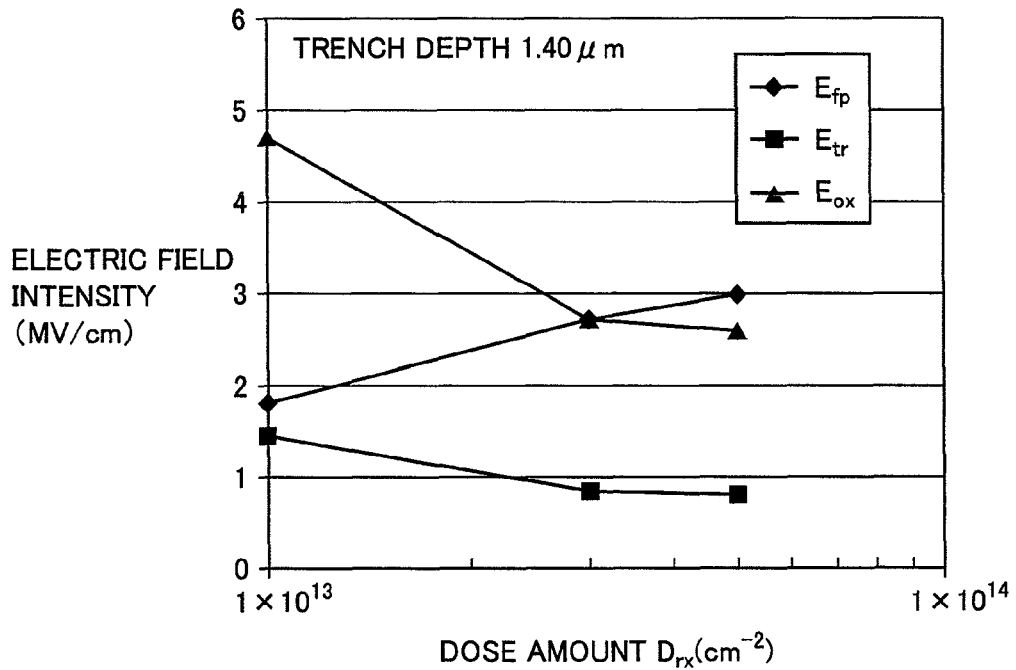
FIG. 34 is a graph exemplifying relation between impurity dose amount $D_{rx}$ in the relaxing region and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.40 μm.
Figure 35:
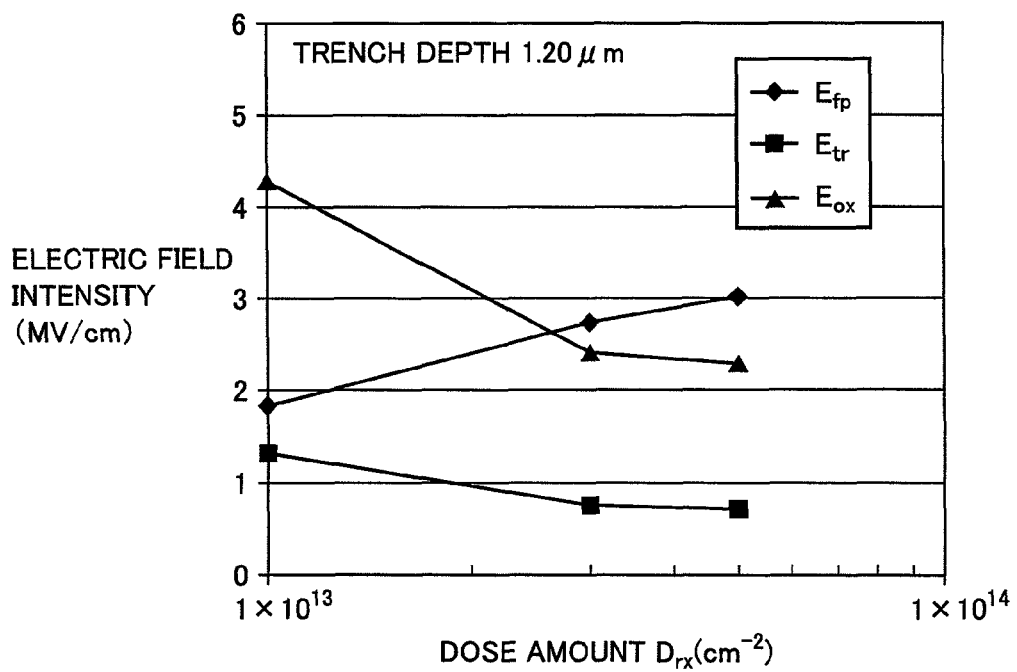
FIG. 35 is a graph exemplifying relation between impurity dose amount $D_{rx}$ in the relaxing region and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.20 μm.
Figure 36:
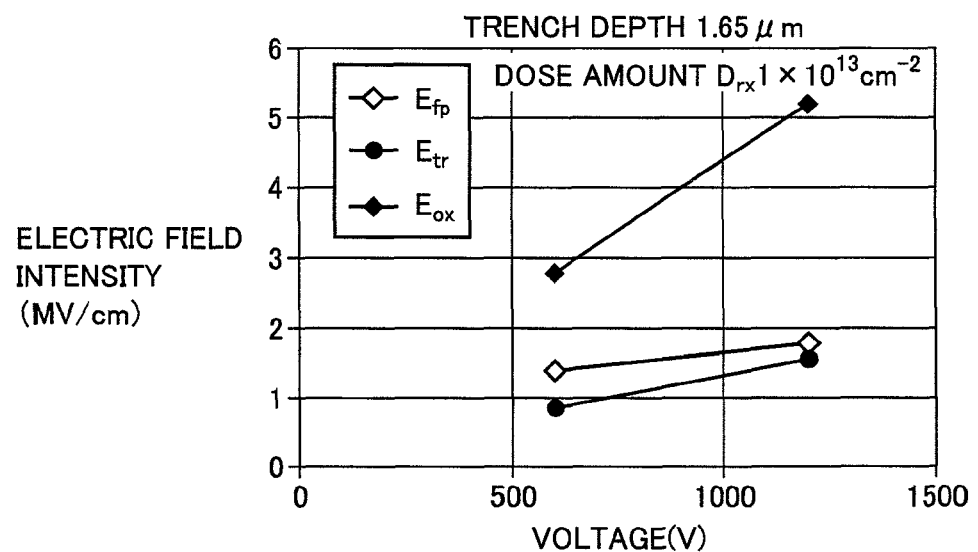
FIG. 36 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.65 μm and impurity dose amount $D_{rx}$ is $1\times10^{13}$ cm$^{-2}$.
Figure 37:
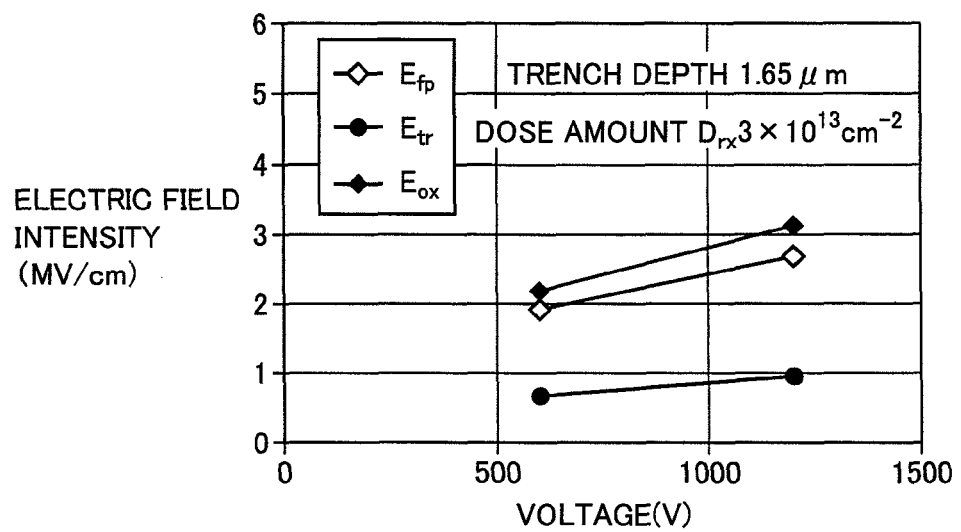
FIG. 37 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.65 μm and impurity dose amount $D_{rx}$ is $3\times10^{13}$ cm$^{-2}$.
Figure 38:
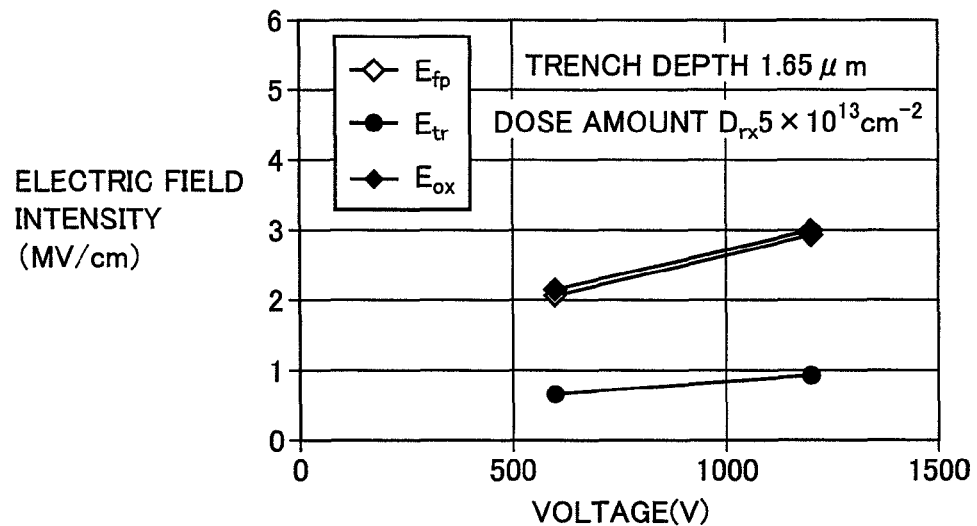
FIG. 38 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.65 μm and impurity dose amount $D_{rx}$ is $5\times10^{13}$ cm$^{-2}$.
Figure 39:
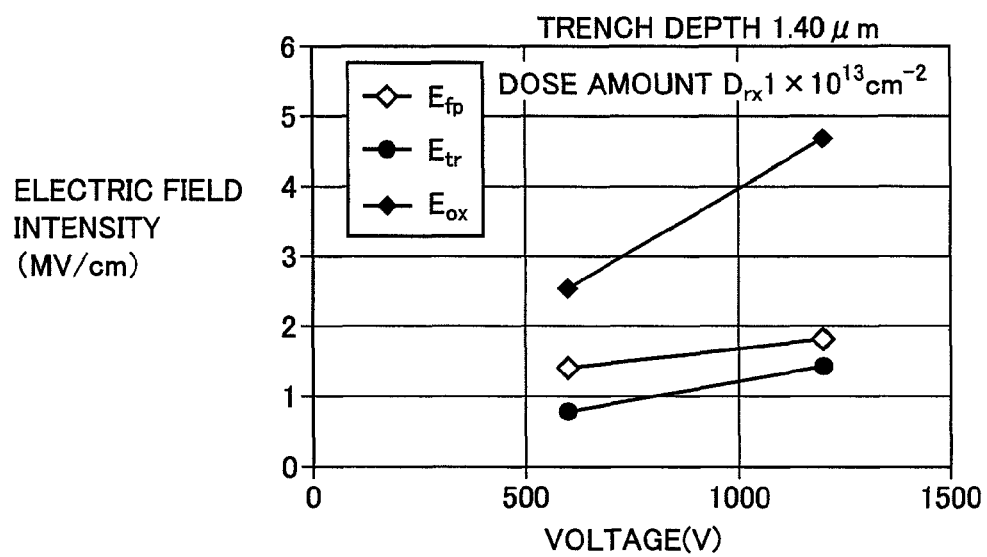
FIG. 39 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.40 μm and impurity dose amount $D_{rx}$ is $1\times10^{13}$ cm$^{-2}$.
Figure 40:
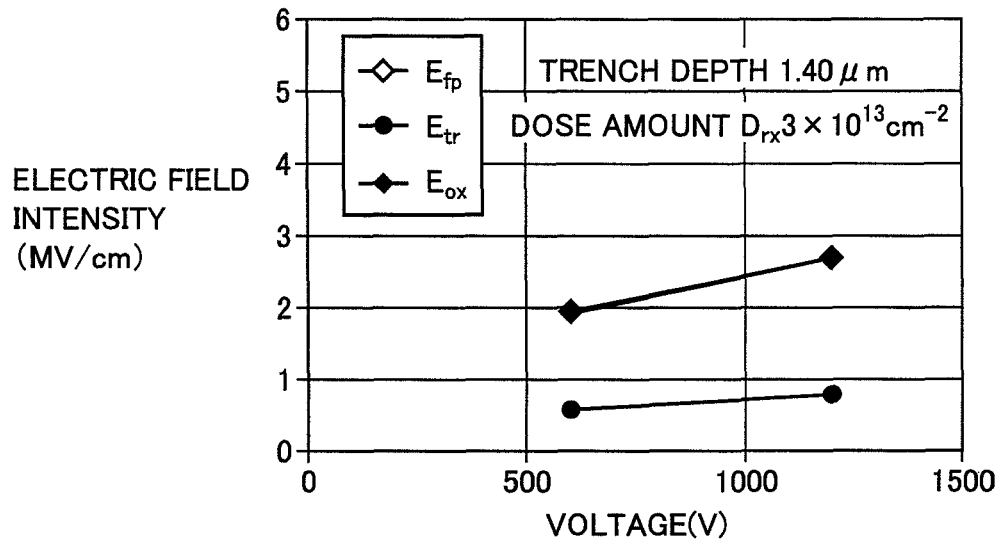
FIG. 40 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.40 μm and impurity dose amount $D_{rx}$ is $3\times10^{13}$ cm$^{-2}$.
Figure 41:
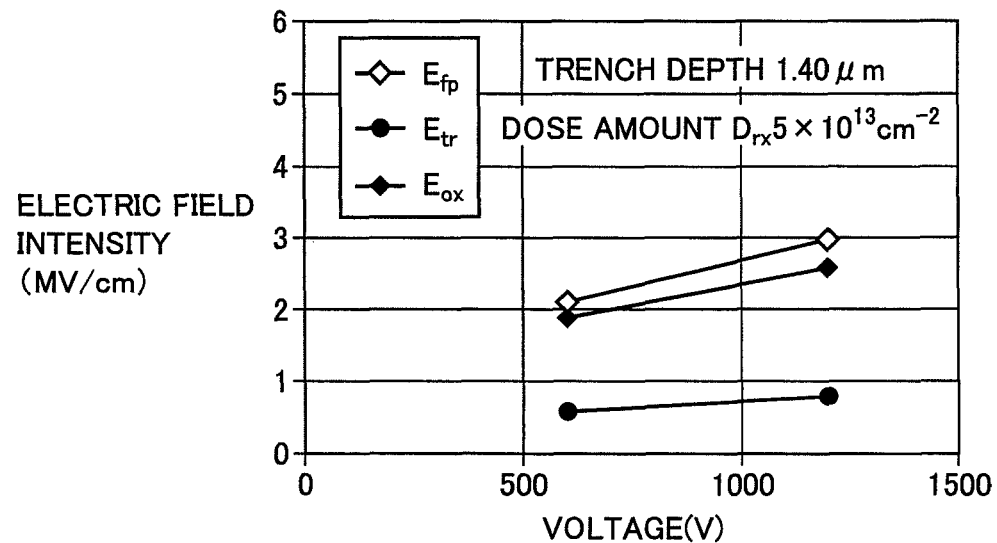
FIG. 41 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.40 μm and impurity dose amount $D_{rx}$ is $5\times10^{13}$ cm$^{-2}$.
Figure 42:
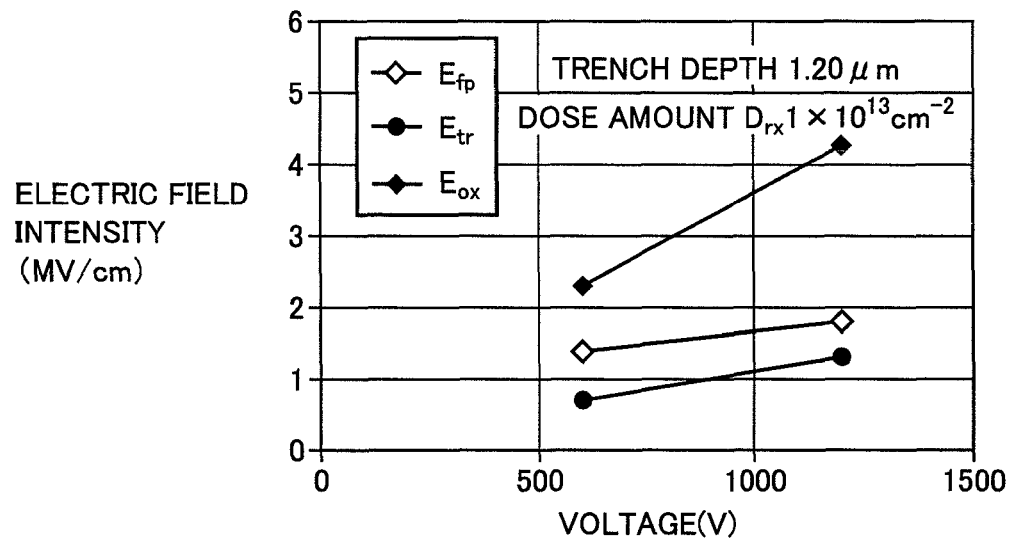
FIG. 42 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.20 μm and impurity dose amount $D_{rx}$ is $1\times10^{13}$ cm$^{-2}$.
Figure 43:
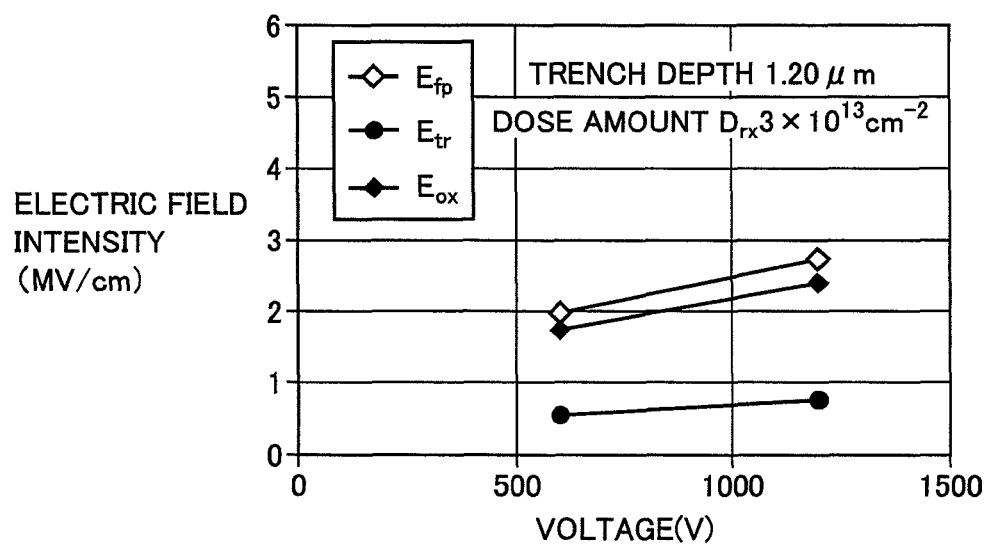
FIG. 43 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.20 μm and impurity dose amount $D_{rx}$ is $3\times10^{13}$ cm$^{-2}$.
Figure 44:
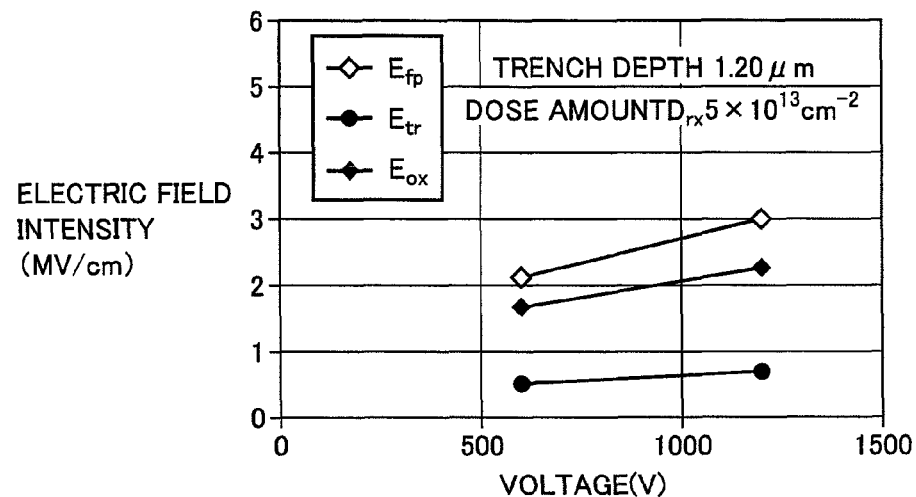
FIG. 44 is a graph exemplifying relation between a voltage and each of electric field intensity $E_{fp}$ applied to the interface between the drift layer and the relaxing region, electric field intensity $E_{tr}$ applied to the drift layer in the trench, and electric field intensity $E_{ox}$ applied to the gate insulating film in a case where the trench has a depth of 1.20 μm and impurity dose amount $D_{rx}$ is $5\times10^{13}$ cm$^{-2}$.

FIGS. 33 to 44 show results of simulation in connection with trench-structure MOSFETs. As shown in FIGS. 33 to 35, in a case of impurity dose amount $D_{rx}$ in relaxing region 71 (FIG. 1)$\geq 1 \times 10^{13}$ cm$^{-2}$, electric field intensity $E_{fp}$ applied to the interface between lower drift layer 81a and relaxing region 71 was higher than electric field intensity $E_{tr}$ applied to upper drift layer 81b in trench TR. In other words, electric field borne by relaxing region 71 was increased and thus electric field in trench TR was suppressed. It is considered that, since electric field $E_{ox}$ applied to gate oxide film 91 on trench TR is thus suppressed, a breakdown voltage is raised. As shown in FIGS. 36 to 44, even when 600 V is applied across drain electrode 98 and source electrode 94 (FIG. 1), $E_{ox}$ applied to gate oxide film 91 was lower than 3 MV/cm. Therefore, it was found that a breakdown voltage could be not lower than 600 V.

It is noted that, referring to FIG. 1, in this simulation, such conditions that a cell pitch in an x direction in the xy coordinate system was set to 10 μm, a thickness of lower drift layer 81a was set to 12 μm, an impurity concentration in lower drift layer 81a was set to $4 \times 10^{15}$ cm$^{-3}$, a range x of extension of relaxing region 71=1 to 3 μm was set, an impurity concentration in upper drift layer 81b was set to $7.5 \times 10^{15}$ cm$^{-3}$, a width of opening of trench TR was set to 3 μm, and an angle of sidewall surface SW of trench TR with respect to upper surface P2 was set to 64.7 degrees were employed.

(Regarding Distance $L_{tr}$)

Figure 45:
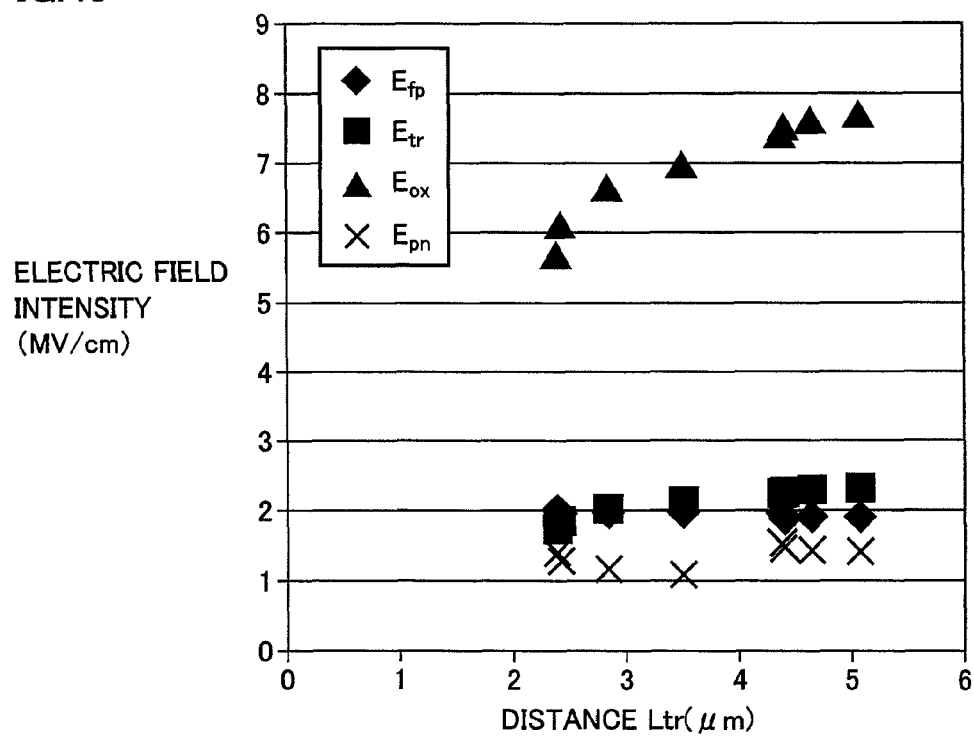
FIG. 45 is a graph exemplifying relation of a distance $L_{tr}$ between the relaxing region and a corner portion of the trench with each of electric field intensity $E_{fp}$ applied to the interface between the drift layer and the relaxing region, electric field intensity $E_{tr}$ applied to the drift layer in the trench, electric field intensity $E_{ox}$ applied to the gate insulating film, and electric field intensity $E_{pn}$ applied to an interface between the drift layer and a body region.

FIG. 45 shows results of simulation of relation between distance $L_{tr}$ in a trench-structure MOSFET (FIG. 17) and each of electric field intensity $E_{fp}$ applied to the interface between lower drift layer 81a and relaxing region 71, electric field intensity $E_{tr}$ applied to upper drift layer 81b in trench TR, electric field intensity $E_{ox}$ applied to gate oxide film 91, and electric field intensity $E_{pn}$ applied to the interface between upper drift layer 81b and p body layer 82. Breakdown of gate oxide film 91 has been said to occur at electric field intensity $E_{ox}$=8 to 10 MV/cm, however, in order to reliably prevent breakdown, electric field intensity $E_{ox}$ is desirably not higher than 7 MV/cm. This demand was met when distance $L_{tr}$ was set to 4 μm or smaller.

It is noted that, referring to FIG. 17, in this simulation, such conditions as a coordinate of a trench corner portion in the xy coordinate system of (4.6 μm, 1.65 μm), an impurity concentration in lower drift layer 81a of $4.5 \times 10^{15}$ cm$^{-3}$, an impurity concentration in upper drift layer 81b of $7.5 \times 10^{15}$ cm$^{-3}$, and an impurity dose amount in relaxing region 71 of $1.0 \times 10^{13}$ cm$^{-2}$ were employed. In first calculation for simulating a structure where distance $L_{tr}$ is relatively small, a thickness of lower drift layer 81a was set to 8 μm, a thickness of upper drift layer 81b was set to 4 μm, and ranges x of extension of relaxing region 71 were set to x=0 to 2 μm (distance $L_{tr}$=3.5 μm), x=1 to 3 μm (distance $L_{tr}$=2.84 μm), x=2 to 4 μm (distance $L_{tr}$=2.43 μm), and x=3 to 5 μm (distance $L_{tr}$=2.38 μm). In second calculation for simulating a structure where distance $L_{tr}$ is relatively great, a thickness of lower drift layer 81a was set to 6 μm, a thickness of upper drift layer 81b was set to 6 μm, and ranges x of extension of relaxing region 71 were set to x=0 to 2 μm (distance $L_{tr}$=5.07 μm), x=1 to 3 μm (distance $L_{tr}$=4.63 μm), x=2 to 4 (distance $L_{tr}$=4.39 μm), and x=3 to 5 (distance $L_{tr}$=4.37 μm).

(Regarding Electric Field Intensity in Planar-Structure MOSFET)

Figure 46:
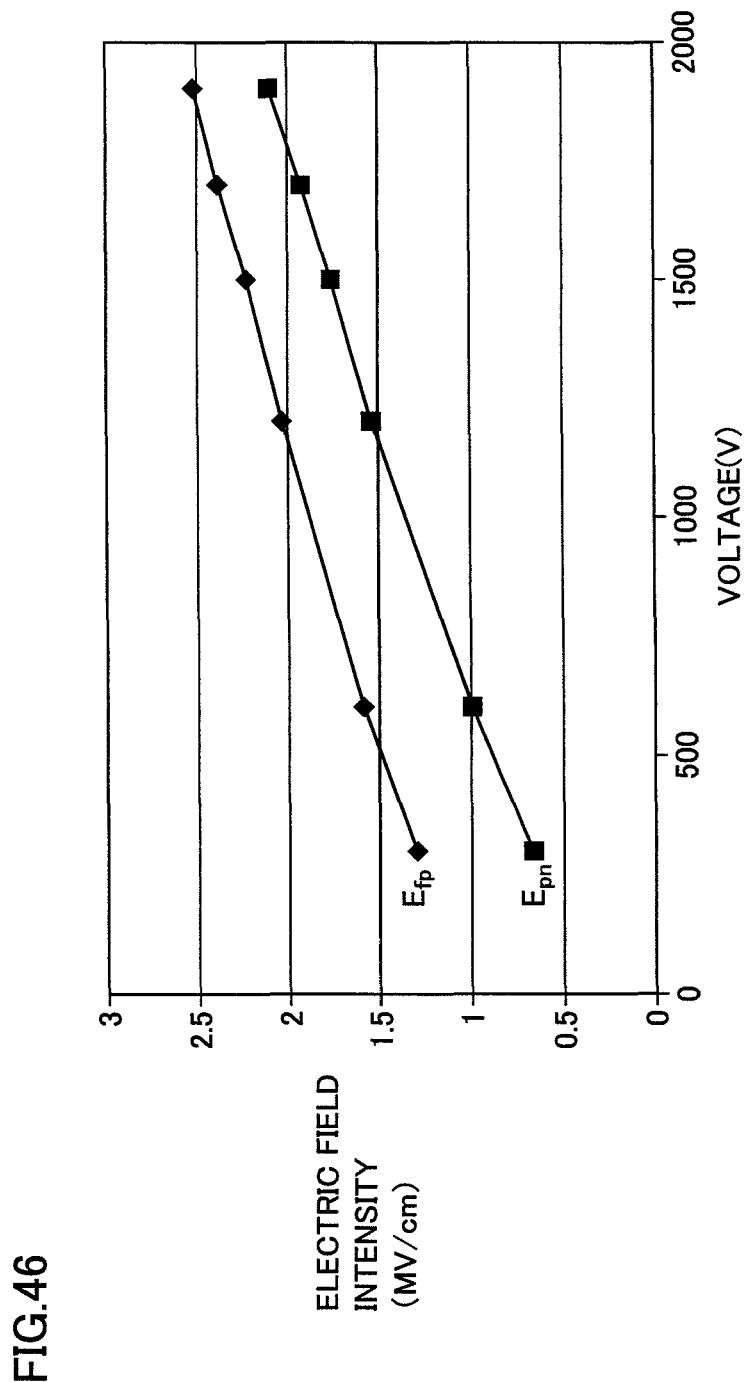
FIG. 46 is a graph exemplifying relation between a voltage and each of electric field intensity $E_{fp}$ applied to the interface between the drift layer and the relaxing region and electric field intensity $E_{pn}$ applied to the interface between the drift layer and the body region, in a planar-structure MOSFET.

As shown in results of simulation in FIG. 46, it was found that, by providing relaxing region 75 (FIG. 31), electric field intensity higher than electric field intensity $E_{pn}$ applied to the interface between upper drift layer 81b and p body region 82P was generated as electric field intensity $E_{fp}$ to be applied to the interface between lower drift layer 81a and relaxing region 75. It is considered that a breakdown voltage is thus raised.

It is noted that, referring to FIG. 31, in this simulation, an impurity concentration in p contact region 84P was set to $8 \times 10^{19}$ cm$^{-3}$, a thickness of p contact region 84P was set to 0.3 μm, an impurity concentration in n region 83P was set to $2 \times 10^{19}$ cm$^{-3}$, a thickness of n region 83P was set to 0.2 μm, an impurity concentration on a surface side of p body region 82P was from $1 \times 10^{16}$ cm$^{-3}$ to $5 \times 10^{17}$ cm$^{-3}$, an impurity concentration on a bottom side of p body region 82P was from $5 \times 10^{17}$ cm$^{-3}$ to $3 \times 10^{18}$ cm$^{-3}$, a channel length was around 1 μm, a cell pitch was set to 11 μm, an impurity concentration in n drift layer 81 was set to $6 \times 10^{15}$ cm$^{-3}$, a thickness of n drift layer 81 was set to 15 μm, and impurity dose amount $D_{rx}$ in relaxing region 75 was set to $1 \times 10^{13}$ cm$^{-2}$.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising:
   a silicon carbide layer having a first main surface and a second main surface opposite to said first main surface, said silicon carbide layer including a drift layer forming said first main surface and having a first conductivity type, a body region provided on said drift layer and having a second conductivity type different from said first conductivity type, a source region provided on said body region to be spaced apart from said drift layer by said body region, forming said second main surface, and having said first conductivity type, and a relaxing region provided within said drift layer and having said second conductivity type, said relaxing region having an impurity dose amount $D_{rx}$ and a distance $L_d$ from said first main surface, said drift layer having an impurity concentration $N_d$ between said first main surface and said relaxing region, and relation of $D_{rx} > L_d \cdot N_d$ being satisfied;

a gate insulating film provided on said body region so as to connect said source region and said drift layer to each other;

a gate electrode provided on said gate insulating film;

a first electrode opposed to said first main surface; and a second electrode opposed to said second main surface.

2. The silicon carbide semiconductor device according to claim 1, wherein relation of $L_d \geq 5$ μm is satisfied.

3. The silicon carbide semiconductor device according to claim 1, wherein relation of $D_{rx} \geq 1 \times 10^{13}$ cm$^{-2}$ is satisfied.

4. The silicon carbide semiconductor device according to claim 1, wherein
   a breakdown voltage across said first and second electrodes is equal to or higher than 600 V.

5. The silicon carbide semiconductor device according to claim 1, further comprising a single crystal substrate provided between said first main surface of said silicon carbide layer and said first electrode, being in contact with each of said first main surface of said silicon carbide layer and said first electrode, composed of silicon carbide, having said first conductivity type, and having an impurity concentration higher than said impurity concentration $N_d$.

6. The silicon carbide semiconductor device according to claim 1, wherein
   said second main surface of said silicon carbide layer is provided with a trench, said trench has a sidewall surface passing through said source region and said body region to reach said drift layer and a bottom surface located on said drift layer,
   said gate insulating film covers each of said sidewall surface and said bottom surface of said trench, and
   said relaxing region is provided at a position deeper than said bottom surface of said trench.

7. The silicon carbide semiconductor device according to claim 6, wherein
   a distance $L_{tr}$ between said relaxing region and said bottom surface of said trench is not greater than 4 μm.

8. The silicon carbide semiconductor device according to claim 1, wherein
   said second main surface of said silicon carbide layer includes a flat surface having said source region, said body region, and said drift layer, and
   said gate insulating film is provided on said flat surface.

9. The silicon carbide semiconductor device according to claim 8, wherein
   said body region is a well region having a side surface and a bottom surface as well as a corner portion between said side surface and said bottom surface, and
   a distance $L_{pn}$ between said relaxing region and said corner portion of said well region is not greater than 4 μm.

* * * * *